(12) United States Patent
Suzuki et al.

(10) Patent No.: US 6,967,353 B2
(45) Date of Patent: Nov. 22, 2005

(54) SEMICONDUCTOR LIGHT EMITTING DEVICE AND FABRICATION METHOD THEREOF

(75) Inventors: Jun Suzuki, Kanagawa (JP); Hiroyuki Okuyama, Kanagawa (JP); Goshi Biwa, Kanagawa (JP); Etsuo Morita, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/341,706

(22) Filed: Jan. 14, 2003

(65) Prior Publication Data

US 2003/0180977 A1 Sep. 25, 2003

(30) Foreign Application Priority Data

Jan. 18, 2002 (JP) ............................. 2002-010685

(51) Int. Cl.[7] ................. H01L 29/22; H01L 29/24; H01L 29/18; H01L 33/00
(52) U.S. Cl. .................. 257/95; 257/88; 257/94; 257/101; 257/103
(58) Field of Search .............................. 257/51, 53, 58, 257/82, 83, 88, 90, 101, 103, 61, 63, 94, 257/95

(56) References Cited

U.S. PATENT DOCUMENTS

| 4,526,624 A | 7/1985 | Tombrello et al. |
| 5,438,241 A | 8/1995 | Zavracky et al. |
| 5,834,327 A | 11/1998 | Yamazaki et al. |
| 5,989,944 A | 11/1999 | Yoon |
| 6,030,849 A | * 2/2000 | Hasegawa et al. ............ 438/46 |
| 6,110,813 A | 8/2000 | Ota et al. |
| 6,111,277 A | 8/2000 | Ikeda |
| 6,204,079 B1 | 3/2001 | Aspar et al. |
| 6,252,261 B1 | 6/2001 | Usui et al. |
| 6,274,889 B1 | 8/2001 | Ota et al. |
| 6,277,711 B1 | 8/2001 | Wu |
| 6,316,357 B1 | 11/2001 | Lin et al. |
| 6,403,451 B1 | 6/2002 | Linthicum et al. |
| 6,576,571 B2 | 6/2003 | Biwa et al. |
| 6,583,445 B1 | 6/2003 | Reedy et al. |
| 6,586,778 B2 | 7/2003 | Linthicum et al. |
| 6,610,144 B2 | 8/2003 | Mishra et al. |
| 6,613,610 B2 | 9/2003 | Iwafuchi et al. |
| RE38,466 E | 3/2004 | Inoue et al. |
| 2003/0107047 A1 * | 6/2003 | Okuyama et al. ............. 257/95 |
| 2004/0051110 A1 * | 3/2004 | Oohata ........................ 257/89 |

* cited by examiner

Primary Examiner—Craig A. Thompson
Assistant Examiner—Heather Doty
(74) Attorney, Agent, or Firm—Robert J. Depke; Trexler, Bushnell, Giangiorgi, Blackstone & Marr

(57) ABSTRACT

A semiconductor light emitting device includes a crystal layer formed on a substrate, the crystal layer having a tilt crystal plane tilted from the principal plane of the substrate, and a first conductive type layer, an active layer, and a second conductive type layer, which are formed on the crystal layer in such a manner as to extend within planes parallel to the tilt crystal plane, wherein the device has a shape formed by removing the apex and its vicinity of the stacked layer structure formed on the substrate. Such a semiconductor light emitting device is excellent in luminous efficiency even if the device has a three-dimensional device structure. The present invention also provides a method of fabricating the above semiconductor light emitting device.

11 Claims, 28 Drawing Sheets

F I G. 1 4
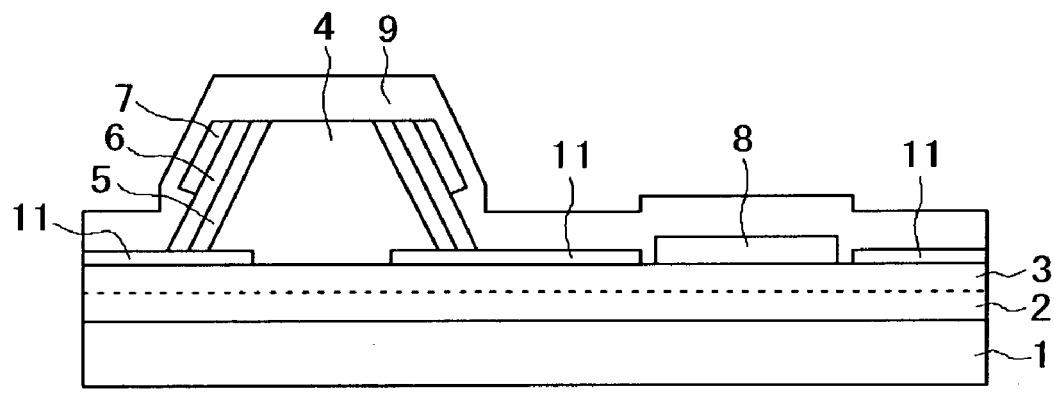
F I G. 1 5
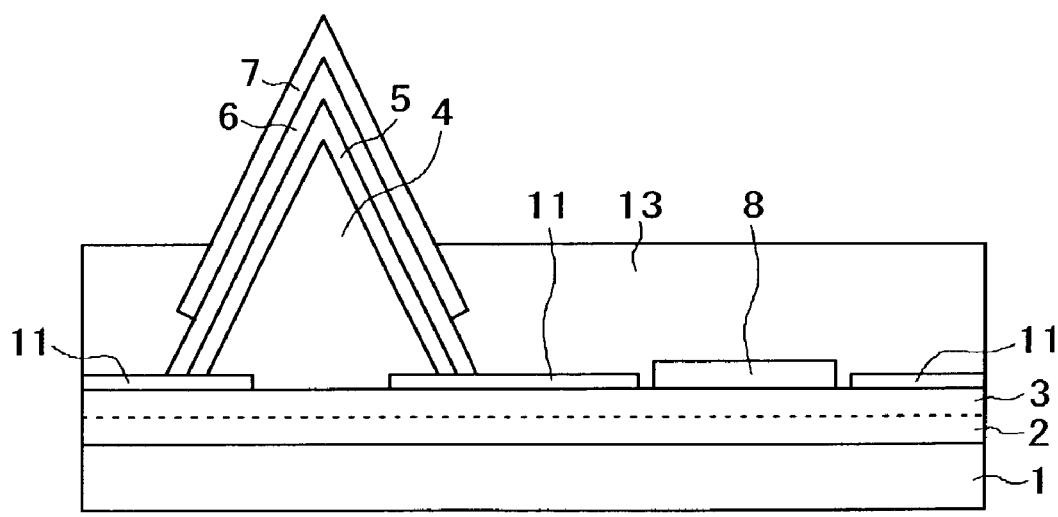

F I G. 2 6
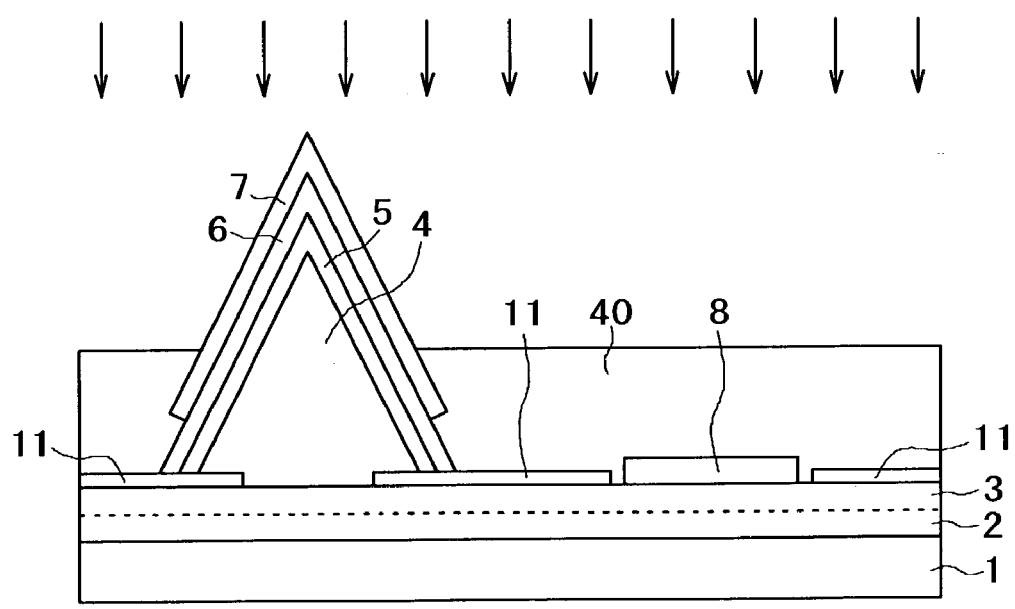

F I G. 3 2
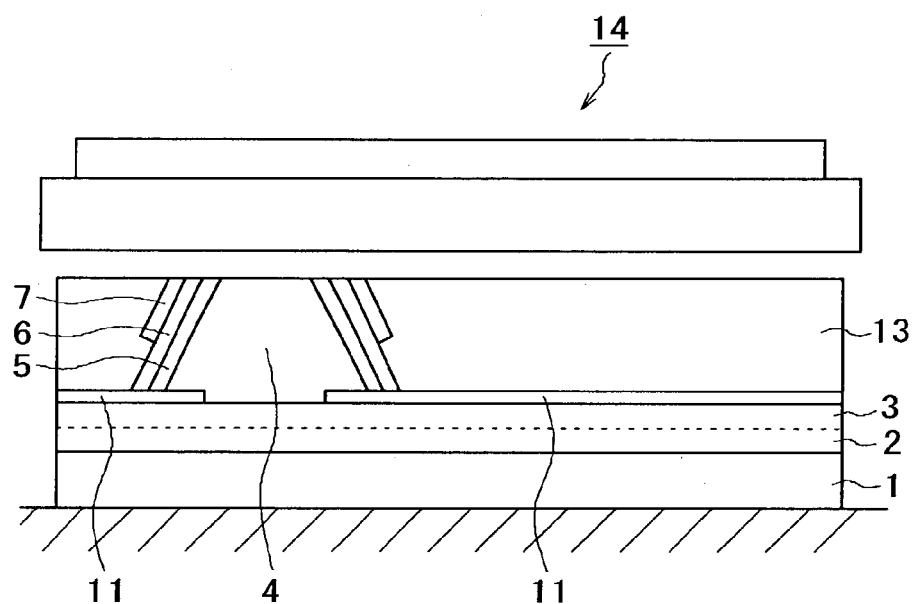
F I G. 3 3
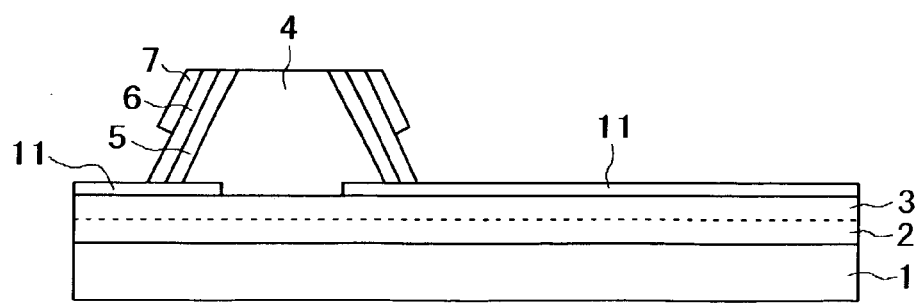

EXCIMER LASER

SEMICONDUCTOR LIGHT EMITTING DEVICE AND FABRICATION METHOD THEREOF

This application claims priority to Japanese Patent Application Number JP2002-010685 filed Jan. 18, 2002, which is incorporated herein by reference.

BACKGROUND OF THE INVENTION

The present invention relates to a semiconductor light emitting device and a fabrication method thereof.

Nitride based III–V compound semiconductors such as GaN, AlGaN and InGaN have forbidden band widths ranging from 1.8 eV to 6.2 eV, and therefore, they are theoretically capable of realizing light emitting devices allowing emission of light having wavelengths in a wide range from a long-wavelength side (for example, red) to a short-wavelength side (for example, ultraviolet). From this viewpoint, in recent years, such nitride based III–V compound semiconductors have become a focus of attention as materials for light emitting devices.

In the case of fabricating a light emitting diode (LED) or a semiconductor laser by using nitride based III–V compound semiconductors, it is required to stack a light emission layer (active layer), a first conductive type layer, and a second conductive type layer, which are made from nitride III–V compound semiconductors such as GaN, AlGaN, and InGaN in such a manner that the active layer is sandwiched between the first and second conductive type layers. In such a light emitting diode or a semiconductor laser, a light emission layer sometimes has an InGaN/GaN quantum well structure or InGaN/AlGaN quantum well structure.

The technique of forming a nitride semiconductor such as a gallium nitride based compound semiconductor by vapor-phase growth has an inconvenience that neither a substrate being lattice matching with the nitride semiconductor nor a substrate with a low dislocation density is present. To cope with such an inconvenience, a technique of reducing dislocations has been disclosed, for example, in Japanese Patent Laid-open No. Sho 63-188938 and Japanese Patent Publication No. Hei 8-8217. The technique includes the steps of depositing a low-temperature buffer layer made from AlN or $Al_xGa_{1-x}N$ (x is 0 or more and less than 1) on the surface of a substrate such as a sapphire substrate at a low temperature of 900° C. or less, and growing a gallium nitride based compound semiconductor thereon, thereby reducing dislocations due to lattice mismatching.

The crystallinity and morphology of a gallium nitride based compound semiconductor layer can be improved by using such a technique.

Another technique for obtaining a high quality crystal having a lower dislocation density has been disclosed, for example, in Japanese Patent Laid-open Nos. Hei 10-312971 and Hei 11-251253. This technique includes the steps of stacking a first gallium nitride based compound semiconductor layer, forming a protective layer made from a material capable of prohibiting the growth of the gallium nitride based compound semiconductor such as silicon oxide or silicon nitride, and growing a second gallium nitride based compound semiconductor layer from a region not covered with the protective film in the in-plane direction (lateral direction), thereby preventing propagation of threading dislocations extending perpendicularly from the boundary with the substrate.

A further technique for reducing a threading dislocation density has been disclosed, for example, MRS Internet J. Nitride Semicond. Res. 4S1, G3. 38 (1999), or Journal of Crystal Growth 189/190 (1998) 83–86. This technique includes the steps of growing a first gallium nitride based compound semiconductor, selectively removing the film by using a reactive ion etching (hereinafter, referred to as "RIE") apparatus, and selectively growing a second gallium nitride based compound semiconductor from the crystal remaining the growth apparatus, thereby reducing the threading dislocations density.

A crystal film having a dislocation density of about $10^6$ $cm^{-2}$ can be obtained by using these techniques, and a long lifetime laser can be realized by using such a crystal layer.

With the use of such a selective growth process, it is possible not only to reduce threading dislocations but also to fabricate a semiconductor device having a three-dimensional structure. For example, a three-dimensional semiconductor device structure can be obtained by forming an anti-growth film on a gallium nitride based compound semiconductor film or a substrate, and selectively growing crystal from an opening formed in the anti-growth film; or selectively removing the gallium nitride based compound semiconductor film or the substrate, and selectively growing crystal from the remaining crystal. Such a semiconductor device has a three-dimensional structure including a side plane composed of the facet and the apex (upper surface) continuous to the side plane, and is therefore advantageous in reducing damages in a device separation step, forming a current constriction structure of a laser, and improving the crystallinity by making effective use of the characteristic of the crystal plane composed of the facet.

FIG. 53 is a sectional view showing one example of a nitride based light emitting device having a three-dimensional shape formed by selective growth. In this example, the light emitting device is configured as a GaN based light emitting diode. As shown in the figure, an n-type GaN layer 102 is formed as an underlying growth layer on a sapphire substrate 101, a silicon oxide film 104 having an opening 103 is formed on the n-type GaN layer 102, and a hexagonal pyramid shaped GaN layer 105 is formed by selective growth from the opening 103 of the silicon oxide film 104.

The GaN layer 105 is a pyramid shaped growth layer covered with the S-plane, that is, the (1-101) plane if the principal plane of the sapphire substrate 101 is taken as the C-plane. The GaN layer 105 is doped with silicon. The tilt S-plane portion of the GaN layer 105 functions as a cladding portion. An InGaN layer 106 is formed as an active layer on the GaN layer 105 in such a manner as to cover the tilt S-plane, and an AlGaN layer and a magnesium-doped GaN layer 107 are formed on the InGaN layer 106.

In such a light emitting diode, a p-electrode 108 and an n-electrode 109 are formed. The p-electrode 108 is formed by vapor-depositing a metal material Ni/Pt/Au or Ni(Pd)/Pt/Au on the magnesium-doped GaN layer 107. The n-electrode 109 is formed by vapor-depositing a metal material Ti/Al/Pt/Au on a portion, exposed from an opening formed in the silicon oxide film 104, of the n-type GaN layer 102.

The above-described light emitting diode formed by selective growth, however, has a problem that the diode contains threading dislocations upwardly extending from the substrate. Another problem is that since the apex and/or the upper surface is surrounded by a side plane composed of a facet where the growth rate is low, the supply of a source gas becomes too large, tending to degrade the crystallinity of the apex and/or the upper surface. As a further problem, if the area of the apex and/or the upper surface is smaller than that of the substrate, it is difficult to control the film thickness and the composition of a mixed crystal at the apex and/or the upper surface. Accordingly, even if a semiconductor device having a three-dimensional structure is formed by selective growth, the crystallinity of the apex and/or the upper surface of the three-dimensional structure is degraded from the above reason, to cause various problems such as leakage of current due to the reduced efficiency by non-radiative recombination and irregular formation of PN junction.

In the case of forming an InGaN layer 106 as an active layer on a side plane of the three-dimensional semiconductor device by selective growth as shown in FIG. 53, an electrode can be formed only on the side plane by a specific electrode formation process; however, since it is difficult to keep the accuracy of photolithography for a three-dimensional structure, it is not easy to accurately form the electrode on the side plane, thereby reducing the yield. Also, in the case of forming an electrode on a side plane of the three-dimensional structure, a current tends to be propagated in a conductive layer being in contact with the electrode depending on the resistivity and the thickness of the conductive layer, with a result that the current is injected in the apex and/or the upper surface, thereby degrading the device characteristics.

SUMMARY OF THE INVENTION

An object of the present invention is to provide a semiconductor light emitting device excellent in luminous efficiency even if the device has a three-dimensional device structure formed by selective growth or the like, and a method of fabricating the semiconductor light emitting device.

To achieve the above object, according to a first aspect of the present invention, there is provided a semiconductor light emitting device including: a crystal layer formed on a substrate, the crystal layer having a tilt crystal plane tilted from the principal plane of the substrate; and a first conductive type layer, an active layer, and a second conductive type layer, which are formed on the crystal layer in such a manner as to extend within planes parallel to the tilt crystal plane; wherein the device has a shape formed by removing the apex and its vicinity of the stacked layer structure formed on the substrate.

According to a second aspect of the present invention, there is provided a method of fabricating a semiconductor light emitting device, including the steps of forming a mask layer having an opening or a crystal seed layer on a substrate, selectively forming a crystal layer from the opening of the mask layer or the crystal seed layer, the crystal layer having a tilt crystal plane tilted from the principal plane of the substrate, forming, on the crystal layer, a first conductive type layer, an active layer, and a second conductive type layer, which extend within planes parallel to the tilt crystal plane, and removing the apex and its vicinity of the stacked layer structure formed on the substrate.

According to the above-described semiconductor light emitting device of the present invention, since the device has a shape formed by removing the apex and its vicinity and/or the upper surface and its vicinity of a three-dimensional structure surrounded by a tilt crystal plane tilted from the principal plane of the substrate, treading dislocations extending from the substrate to the apex and its vicinity of the three-dimensional structure are removed. Also, since the apex and its vicinity and/or the upper surface and its vicinity, in which crystallinity is poor, of the three-dimensional structure are removed, the device has only a portion in which crystallinity is excellent. As a result, it is possible to prevent occurrence of leakage of current due to treading dislocations and poor crystallinity in the apex and its vicinity and/or the upper surface and its vicinity, and hence to prevent the luminous efficiency from being reduced by leakage of current. In this way, the semiconductor light emitting device of the present invention makes it possible to realize an excellent luminous efficiency and a high luminance.

According to the present invention, by arraying a plurality of the above-described semiconductor light emitting devices, it is possible to obtain an image display unit or an illuminating unit having a structure that each of the semiconductor light emitting devices constitutes a pixel.

According to a third aspect of the present invention, there is provided a semiconductor light emitting device including a crystal layer formed on a substrate, the crystal layer having the S-plane tilted from the principal plane of the substrate or a plane substantially equivalent to the S-plane, and a first conductive type layer, an active layer, and a second conductive type layer, which are formed on the crystal layer in such a manner as to extend within planes parallel to the S-plane or a plane substantially equivalent to the S-plane, wherein the device has a shape formed by removing the apex and its vicinity of the stacked layer structure formed on the substrate.

According to a fourth aspect of the present invention, there is provided a method of fabricating a semiconductor light emitting device, including the steps of forming a mask layer having an opening or a crystal seed layer on a substrate, selectively forming a crystal layer from the opening of the mask layer or the crystal seed layer, the crystal layer having the S-plane or a plane substantially equivalent to the S-plane, forming, on the crystal layer, a first conductive type layer, an active layer, and a second conductive type layer, which extend within planes parallel to the S-plane and a plane substantially equivalent to the S-plane, and removing the apex and its vicinity of the stacked layer structure formed on the substrate.

According to the above-described semiconductor light emitting device of the present invention, since the device has a shape formed by removing the apex and its vicinity and/or the upper surface and its vicinity of a three-dimensional structure surrounded by the S-plane tilted from the principal plane of the substrate or a plane substantially equivalent to the S-plane, treading dislocations extending from the substrate to the apex and its vicinity of the three-dimensional structure are removed. Also, since the apex and its vicinity and/or the upper surface and its vicinity, in which crystallinity is poor, of the three-dimensional structure are removed, the device has only a portion in which crystallinity is excellent. As a result, it is possible to prevent occurrence of leakage of current due to treading dislocations and poor crystallinity in the apex and its vicinity and/or the upper surface and its vicinity, and hence to prevent the luminous efficiency from being reduced by leakage of current. In this way, the semiconductor light emitting device of the present invention makes it possible to realize an excellent luminous efficiency and a high luminance.

According to the present invention, by arraying a plurality of the above-described semiconductor light emitting devices, it is possible to obtain an image display unit or an illuminating unit having a structure that each of the semiconductor light emitting devices constitutes a pixel.

BRIEF DESCRIPTION OF THE DRAWINGS

These and other objects, features and advantages of the present invention will be apparent from the following description taken in connection with the accompanying drawings wherein:

FIG. 14 is a sectional view illustrating a step of fabricating the semiconductor light emitting device according to the first embodiment, showing a state that an insulating layer is formed;

FIG. 15 is a sectional view illustrating a step of fabricating a semiconductor light emitting device according to a second embodiment, showing a state that a stacked layer structure is buried in a resin;

FIG. 26 is a sectional view illustrating a step of fabricating the semiconductor light emitting device according to the fourth embodiment, showing a state that the apex and its vicinity of the stacked layer structure are subjected to dry etching;

FIG. 32 is a sectional view illustrating a step of fabricating the semiconductor light emitting device according to the fifth embodiment, showing a state that the stacked layer structure becomes an approximately hexagonal truncated pyramid shape by CMP;

FIG. 33 is a sectional view illustrating a step of fabricating the semiconductor light emitting device according to the fifth embodiment, showing a state that the resin is removed;

DETAILED DESCRIPTION OF THE PREFERRED EMBODIMENTS

Figure 1:
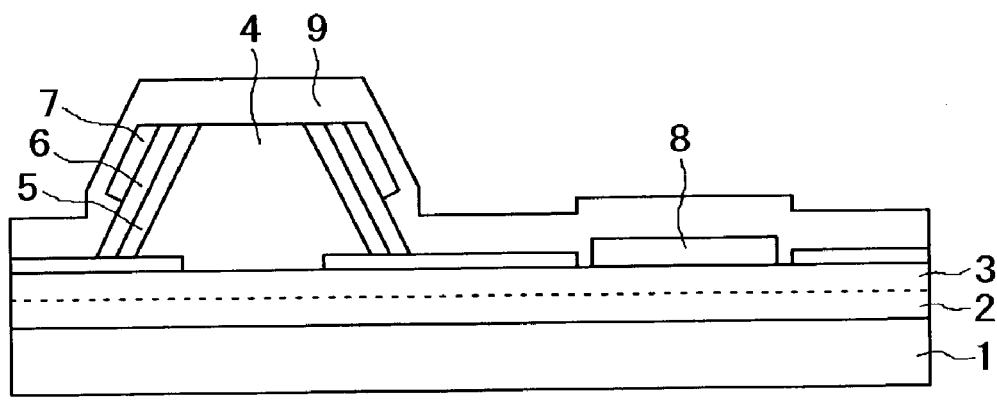
FIG. 1 is a sectional view showing a semiconductor light emitting device according to a first embodiment.

Hereinafter, the present invention will be described in detail with reference to the drawings. It is to be noted that in the drawings, parts of a semiconductor light emitting device of the present invention are sometimes depicted on a scale different from the actual scale for the sake of convenience of description.

A semiconductor light emitting device of the present invention is characterized by including a crystal layer formed on a substrate, the crystal layer having a tilt crystal plane tilted from the principal plane of the substrate, and a first conductive type layer, an active layer, and a second conductive type layer, which are formed on the crystal layer in such a manner as to extend within planes parallel to the tilt crystal plane, wherein the device has a shape formed by removing the apex and its vicinity of the stacked layer structure formed on the substrate.

The substrate used herein is not particularly limited insofar as it allows a crystal layer having a tilt crystal plane tilted from the principal plane of the substrate to be formed thereon, and may be selected from various substrates, for examples, substrates made from sapphire ($Al_2O_3$, having A-plane, R-plane, or C-plane), SiC (including 6H, 4H, and 3C), GaN, Si, ZnS, ZnO, AlN, LiMgO, GaAs, $MgAl_2O_4$, and InAlGaN. Of these substrates, hexagonal or cubic crystal based substrates are preferred, with the hexagonal substrates being most preferred.

In the case of using a sapphire substrate, the C-plane of sapphire may be taken as the principal plane of the substrate. In general, the sapphire substrate with the C-plane of sapphire taken as the principal plane thereof has been often used to grow a gallium nitride (GaN) based compound semiconductor thereon. It is to be noted that the C-plane of sapphire taken as the principal plane of the sapphire substrate is not limited to the theoretical C-plane but may be a plane tilted from the theoretical C-plane by an angle 5 to 6 degrees.

The substrate may not be a constituent of a light-emitting device as a product. In other words, the substrate may be used merely to hold a device portion and be removed before the device is accomplished.

The crystal layer formed on the substrate has a tilt crystal plane tilted from the principal plane of the substrate. The crystal layer is not particularly limited insofar as it allows a light-emitting region (to be described later) composed of a first conductive type layer, an active layer, and a second conductive type layer to be form on a plane parallel to the tilted crystal plane, tilted from the principal plane of the substrate, of the crystal layer. In general, the crystal layer is preferably made from a material having a wurtzite type crystal structure.

For example, such a crystal layer may be made from a material selected from a group III based compound semiconductor, a BeMgZnCdS based compound semiconductor, a BeMgZnCdO based compound semiconductor, a gallium nitride (GaN) based compound semiconductor, an aluminum nitride (ATN) based compound semiconductor, an indium nitride (InN) based compound semiconductor, an indium gallium nitride (InGaN) based compound semiconductor, and an aluminum gallium nitride (AlGaN) based compound semiconductor. Of these materials, a nitride semiconductor such as a gallium nitride based compound semiconductor is preferably used as the material for forming the crystal layer.

It is to be noted that according to the present invention, the nitride semiconductor expressed by InGaN, AlGaN, or GaN does not necessarily mean only InGaN, AlGaN, or GaN in the form of a strict ternary or binary mixed crystal. For example, the nitride semiconductor expressed by InGaN may contain a trace amount of Al and other impurities which do not affect the function of InGaN without departing from the scope of the present invention.

The crystal layer can be formed by a chemical vapor deposition process selected, for example, from a metal organic chemical vapor deposition (MOCVD) process including a metal organic vapor phase epitaxy (MOVPE) process, a molecular beam epitaxy (MBE) process, and a hydride vapor phase epitaxy (HVPE) process. In particular, the MOCVD process is preferred because it rapidly yields a crystal layer with a desirable crystallinity. The MOCVD method commonly employs alkyl metal compounds, such as TMG (trimethylgallium) or TEG (triethylgallium) as a Ga source, TMA (trimethylaluminum) or TEA (triethylaluminum) as an Al source, and TMI (trimethylindium) or TEI (triethylindium) as an In source. It also employs ammonia gas or hydrazine gas as a nitrogen source, and other gases as an impurity source, for example, silane gas for Si, germane gas for Ge, $Cp_2Mg$ (cyclopentadienylmagnesium) for Mg, and DEZ (diethylzinc) for Zn. In the general MOCVD process, the gases are fed to the surface of the substrate heated at about 600° C. or more, and are decomposed to form a layer of an InAlGaN based compound semiconductor by epitaxial growth.

It is preferred to form an underlying growth layer on the substrate and to form the crystal layer on the underlying growth layer.

The underlying growth layer can be formed by the same chemical vapor deposition process as that used for forming the crystal layer, for example, the metal organic chemical vapor deposition (MOCVD) process, molecular beam epitaxy (MBE) process, or hydride vapor phase epitaxy (HVPE) process.

The underlying growth layer may be made from, for example, gallium nitride or aluminum nitride, and may have a structure composed of a combination of a low-temperature buffer layer and a high-temperature buffer layer, or a combination of a buffer layer and a crystal seed layer functioning as a crystal seed.

The above structure of the underlying growth layer will be described in detail below.

If the crystal layer is formed by crystal growth from a low-temperature buffer layer, there occurs a problem that polycrystals tend to be deposited on the mask layer. To solve such a problem, a high-temperature buffer layer may be formed on the low-temperature buffer layer and then the crystal layer be formed thereon so as to be grown along a plane different from the principal plane of the substrate. With this configuration, the crystal layer with a desirable crystallinity can be formed by crystal growth.

In the case of using no crystal seed layer at the time of forming the crystal layer, the crystal layer is required to be formed by selective crystal growth from a buffer layer. At this time, however, there occurs a problem that crystal growth is liable to occur even in an anti-growth region where the crystal growth is not required. To solve such a problem, a crystal seed layer may be formed on the buffer layer and the crystal layer be formed by selective crystal growth from the crystal seed layer. With this configuration, the crystal layer can be selectively formed in a region where the crystal growth is required.

The low-temperature buffer layer is intended to relieve lattice mismatch between the substrate and a nitride semiconductor. Accordingly, if the substrate has a lattice constant close to or identical to that of a nitride semiconductor, the low-temperature buffer layer is not necessarily provided. For example, an AlN layer may be grown on an SiC substrate as a high-temperature buffer layer without lowering the growth temperature, and an AlN or GaN layer may be grown on an Si substrate as a high-temperature buffer layer without lowering the growth temperature. Even in this case, a GaN layer with a desirable crystallinity can be formed by crystal growth on the buffer layer. Additionally, in the case of using a GaN substrate, the structure without any buffer layer may be adopted.

In fabrication of the semiconductor light emitting device according to this embodiment, the crystal layer having a tilt crystal plane tilted from the principal plane of the substrate is formed by using the selective growth process.

The tilt crystal plane, tilted from the principal plane of the substrate, of the crystal layer is grown depending on the kind of the principal plane of the substrate.

If the crystal layer is grown on the (0001) plane [C-plane] as the principal plane of the substrate having the wurtzite type crystal structure, the tilt crystal plane of the crystal layer becomes one selected from the (1-100) plane [M-plane], the (1-101) plane [S-plane], the (11-20) plane [A-plane], the (1-102) plane [R-plane], the (1-123) plane [N-plane], the (11-22) plane, and crystal planes equivalent thereto. In particular, it is preferred to grow the crystal layer with the S-plane or the (11-22) plane, or the crystal plane equivalent thereto. It is to be noted that the crystal plane equivalent to the S-plane or the (11-22) plane is the crystal plane tilted from the S-plane or the (11-22) plane by an angle of 5 to 6 degrees.

In particular, the S-plane is a stable plane selectively grown on the $C^+$-plane and is therefore relatively obtainable. The S-plane is expressed by the (1-101) plane in accordance with Miller indices of a hexagonal crystal system. Just as the C-plane includes the $C^+$-plane and the $C^-$-plane, the S-plane includes the $S^+$-plane and the $S^-$-plane. In this specification, the $S^+$-plane is grown on the $C^+$-plane of GaN, and it is referred to as the S-plane unless otherwise stated. Of the S-planes, the $S^+$-plane is stable. In addition, the Miller index of the $C^+$-plane is (0001).

In the case of growing the S-plane of the crystal layer made from a gallium nitride based compound semiconductor on the $C^+$-plane of the substrate as described above, the number of bonds from Ga to N on the S-plane is 2 or 3, which number is second to that on the C-plane. Since the $C^-$-plane cannot be grown on the $C^+$-plane in practice, the number of bonds on the S-plane is the largest.

In the case of growing a wurtzite type nitride, for example, GaN based nitride on a sapphire substrate with the C-plane of sapphire taken as the principal plane thereof, if the selective growth process is not used to grow the nitride, the surface of the nitride is grown as the $C^+$-plane, whereas if the selective growth process is used to grow the nitride, the surface of the nitride can be grown as the S-plane tilted from the C-plane of the sapphire substrate.

On the C$^+$-plane, parallel to the C-plane of the substrate, of the nitride, the bond of N liable to be easily released from the plane combines with one bond of Ga, whereas on the S-plane, tilted from the C-plane of the substrate, of the nitride, the bond of N combines with at least one bond of Ga.

As a result, the V/III ratio of the nitride grown along the S-plane can be effectively increased, to advantageously improve the crystallinity of the laminated structure. In addition, according to the formation of the nitride by the selective growth process, since nitride is grown along a plane different from the orientation of the substrate, dislocations extending upwardly from the substrate may be bent, to advantageously reduce crystal defects of the nitride.

According to the semiconductor light emitting device of the present invention, the crystal layer has a structure having a tilt crystal plane tilted from the principal plane of the substrate, and in particular, the crystal layer may have a structure in which the S-plane or a plane substantially equivalent to the S-plane constitutes a tilt plane of an approximately hexagonal truncated pyramid shape.

According to the semiconductor light emitting device, the crystal layer having a tilt crystal plane tilted from the principal plane of the substrate is formed on the substrate, and the first conductive type layer, the active layer, and the second conductive type layer are formed on the crystal layer in such a manner as to extend within planes parallel to the tilt crystal plane, wherein the above stacked layer structure formed on the substrate has a shape formed by removing the apex and its vicinity thereof.

The tilt crystal plane tilted from the principal plane of the substrate may be the S-plane or a plane substantially equivalent to the S-plane, wherein the S-plane or a plane substantially equivalent to the S-plane may constitute a tilt plane of an approximately hexagonal truncated pyramid shape.

The above-described approximately hexagonal truncated pyramid shape is not necessarily an exact hexagonal truncated pyramid shape but may be an imperfect hexagonal truncated pyramid shape in which one or more faces thereof are lost. According to a preferred embodiment, the tilt crystal plane is composed of nearly symmetric six plane portions. The wording "nearly symmetric six plane portions" means not only "six plane portions being in a perfect symmetric relationship" but also "six plane portions being in a substantially symmetric relationship slightly offset from the perfect symmetric relationship". The ridge between adjacent two crystal plane portions of the crystal layer does not necessarily extend in a straight line. The approximately hexagonal truncated pyramid shape may extend in straight line.

In a three-dimensional semiconductor light emitting device, if treading dislocations extend from a substrate to the apex and/or the upper surface, leakage of current occurs due to the threading dislocations, to degrade the luminous efficiency. Also, at the apex and/or the upper surface of the device, since the apex and/or the upper surface are surrounded by a side plane (facet) where the growth rate is low, the supply of a source gas becomes too large, to degrade the crystallinity. As a result, leakage of current occurs due to the poor crystallinity of the apex and/or the upper surface, to degrade the luminous efficiency.

On the contrary, according to the semiconductor light emitting device of the present invention, since the apex and its vicinity or the upper surface and its vicinity of the three-dimensional structure are removed, threading dislocations extending from the substrate to the apex and its vicinity are removed, and since the apex and its vicinity or the upper surface and its vicinity, in which the crystallinity is poor, of the three-dimensional structure are removed, the semiconductor light emitting device includes only a portion whose crystallinity is desirable.

As a result, it is possible to prevent occurrence of leakage of current due to threading dislocations and poor crystallinity at the apex and its vicinity and/or the upper surface and its vicinity, and hence to prevent the luminous efficiency from being reduced due to leakage of current. Also, since the tilt crystal plane tilted form the principal plane of the substrate is used, it is possible to prevent multiple reflection of emission light, and hence to efficiently emerge light emitted from a light emission region to the outside of the device. In this way, according to the semiconductor light emitting device of the present invention, it is possible to improve the luminous efficiency and enhance the luminescence.

According to the present invention, the uppermost surface of the three-dimensional structure from which the apex and its vicinity have been removed may be a plane or a geometrical shape other than a plane. For example, by removing the apex and its vicinity of the three-dimensional structure along a plane substantially equivalent to the principal plane of the substrate, the uppermost surface of the remaining three-dimensional structure becomes a plane. The plane parallel to the principal plane of the substrate or the plane substantially equivalent to the principal plane of the substrate may be the C-plane formed on the substrate or a plane substantially equivalent to the C-plane. In other words, the remaining three-dimensional structure may be formed into a so-called approximately hexagonal truncated pyramid shape.

The selective growth may be performed by making use of selective removal of part of an underlying growth layer, or making use of an opening selectively formed in a mask layer which is formed on the underlying growth layer or formed before formation of the underlying growth layer.

For example, if the underlying growth layer is composed of a buffer layer and a crystal seed layer, the crystal seed layer is formed on the buffer layer in such a manner as to be divided into scattered small regions each having a diameter of about 10 $\mu$m, and the crystal layer having the S-plane or the like is formed by crystal growth from each of the small regions. For example, the divided regions of the crystal seed layer may be arranged so as to be spaced from each other at intervals of a value equivalent of a margin for separation of adjacent light emitting devices. The divided small region may be formed into a shape selected from a stripe, a lattice, a circle, a square, a hexagon, a triangle, a rectangle, a rhombus, and other shapes deformed therefrom.

The selective growth of the crystal layer may be performed by forming a mask layer on the underlying growth layer, and selectively forming window regions in the mask layer. The mask layer may be made from silicon oxide or silicon nitride. The crystal layer having an approximately hexagonal truncated pyramid shape or an approximately hexagonal pyramid shape extending in straight line in one longitudinal direction as described above can be formed by selective crystal growth from each of stripe-shaped window regions formed in the mask layer or from each of stripe-shaped regions of the crystal seed layer.

By forming, in the mask layer, the window region of a circular shape (or a hexagonal shape whose one side extends along the <1-100> direction or <11-20> direction) having a size of around 10 $\mu$m, it is possible to easily form the crystal layer having a size of about twice as large as the window region by selective growth from the window region. In the crystal layer thus formed by selective growth, since the S-plane tilted from the principal plane of the substrate has an effect of bending and blocking dislocations extending from the substrate, it is possible to reduce the density of dislocations in the crystal layer.

In the case of forming a crystal layer by selective growth from a window region formed in a selective growth mask, the crystal layer is generally grown only in an area over the window region. In this case, to realize lateral growth of the crystal layer, there may be adopted a micro-channel epitaxy process. The use of the micro-channel epitaxy process allows the crystal layer to be laterally grown into a shape larger than the window region.

It is known that the lateral growth of the crystal growth by using the micro-channel epitaxy process is effective to prevent threading dislocations extending from the substrate from being propagated in the crystal layer and hence to reduce the density of dislocations in the crystal layer. The lateral growth of the crystal layer by using the micro-channel epitaxy process is also advantageous in increasing the light-emitting region, equalizing a current, avoiding concentration of current, and reducing the current density.

In the semiconductor light emitting device according to this embodiment, as described above, a crystal layer having a tilt crystal plane tilted from the principal plane of a substrate is formed, and a first conductive type layer, an active layer, and a second conductive type layer are sequentially formed on the crystal layer so as to extend within planes parallel to the tilt crystal plane, tilted from the principal plane of the substrate, of the crystal layer.

The first conductive type layer is a p-type or n-type cladding layer, and the second conductive type layer is an n-type or p-type cladding layer.

For example, in the case of forming the crystal layer having the S-plane by using a gallium nitride based compound semiconductor, the n-type cladding layer made from a silicon-doped gallium nitride based compound semiconductor may be formed on the S-plane of the crystal layer, an active layer made from InGaN be formed on the n-type cladding layer, and the p-type cladding layer made from magnesium-doped gallium nitride based compound semiconductor be formed on the active layer. The semiconductor light emitting device thus produced has a so-called double-hetero structure.

The active layer may have a structure that an InGaN layer be sandwiched between AlGaN layers. Also, the active layer may be of a single bulk layer structure, or a quantum well structure such as a single quantum well (SQW) structure, a double quantum well (DQW) structure, or multiple quantum well (MQW) structure. The quantum well structure uses a barrier layer for separation of quantum wells, if necessary.

The provision of the InGaN layer as the active layer is particularly advantageous in terms of easy fabrication of the light emitting device and improvement of light emission characteristics of the light emitting device. The InGaN layer grown on the S-plane is further advantageous in that since the S-plane has a structure that nitrogen atoms are less releasable, the crystallization of InGaN on the S-plane is particularly easy and the crystallinity of InGaN formed on the S-plane is desirable.

Additionally, a nitride semiconductor has a property to become n-type conductive even in the non-doped state because of nitrogen holes occurring in crystal; however, the nitride semiconductor may be converted into an n-type semiconductor with a desirable concentration of carriers by doping an ordinary donor impurity such as Si, Ge, or Se during crystal growth of the nitride semiconductor.

A nitride semiconductor can be converted into a p-type semiconductor by doping an acceptor impurity such as Mg, Zn, C, Be, Ca, or Ba in crystal of the nitride semiconductor. In this case, to obtain a p-layer with a high carrier density, after being doped with the acceptor impurity, the nitride semiconductor may be activated, for example, by an annealing treatment performed at about 400° C. or more in an inert gas atmosphere such as a nitrogen or argon atmosphere. The activation of the nitride semiconductor may be performed by irradiating the nitride semiconductor with electron beams, microwaves, or light.

The first conductive type layer, the active layer, and the second conductive type layer can be easily formed on the crystal layer so as to extend within planes parallel to the tilt crystal plane, tilted from the principal plane of the substrate, of the crystal layer by continuously forming these layers on the tilt crystal plane of the crystal layer by crystal growth.

In other words, a light emission region composed of the first conductive type layer, the active layer, and the second conductive type layer can be formed partially or wholly on the tilt crystal plane.

In the case of forming the light emission region on the plane parallel to the principal plane of the substrate, light emitted from the light emission region is decayed by multiple reflection, whereas in the case of forming the light emission region on the tilt crystal plane tilted from the principal plane of the substrate, light emitted from the light emission region can be emerged to the outside of the light emitting semiconductor device without occurrence of multiple reflection.

The first conductive type layer functioning as the cladding layer can be made from the same material as that of the crystal layer so as to have the same conductive type as that of the crystal layer. To be more specific, the first conductive type layer can be formed by continuing, after the crystal layer having the tilt crystal plane is formed, the crystal growth while continuously adjusting the concentration of the source gas. Alternatively, the first conductive type layer may be configured as part of the crystal layer having the tilt crystal plane.

According to the semiconductor light emitting device in this embodiment, the luminous efficiency can be increased by making use of a desirable crystallinity of the tilt crystal plane, tilted from the principal plane, of the crystal layer. By injecting a current only into the tilt crystal plane having a desirable crystallinity, it is possible to enhance the luminous efficiency. This is because the InGaN active layer can be desirably formed on the tilt crystal plane having a desirable crystallinity. In addition, the actual area of the active layer extending within a plane being substantially parallel to the tilt crystal plane is larger than the area, projected on the principal plane of the substrate or the underlying growth layer, of the active layer. The enlarged area of the active layer makes it possible to increase the area of the light emission region of the device and thereby reduce the density of a current injected in the light emission region, and to reduce the saturated luminance and thereby increase the luminous efficiency.

An electrode is formed on each of the crystal layer and the second conductive type layer. To reduce the contact resistance, a contact layer may be formed and then the electrode be formed thereon. In the case of forming these electrodes by vapor deposition, if the p-electrode and the n-electrode adhere on both the crystal layer and the crystal seed layer formed under the mask layer, there occurs short-circuit therebetween. To cope with such an inconvenience, each of the electrodes must be accurately formed by vapor deposition.

An image display unit or an illumination unit can be fabricated by arraying a plurality of the semiconductor light emitting devices according to the present invention. In this case, according to the semiconductor light emitting device of the present invention, the electrode area can be suppressed by making use of the tilt crystal plane, and accordingly, by preparing the semiconductor light emitting devices of three primary colors and arraying them in a scannable manner, an image display unit with a reduced electrode area can be realized.

Another semiconductor light emitting device of the present invention is characterized by including a crystal layer formed on a substrate, the crystal layer having the S-plane tilted from the principal plane of the substrate or a plane substantially equivalent to the S-plane, and a first conductive type layer, an active layer, and a second conductive type layer, which are formed on the crystal layer in such a manner as to extend within planes parallel to the S-plane or a plane substantially equivalent to the S-plane, wherein the device has a shape formed by removing the apex and its vicinity of the stacked layer structure formed on the substrate.

The substrate used herein is not particularly limited, and may be any substrate insofar as the crystal layer having the S-plane (to be described later) or a plane substantially equivalent to the S-plane can be formed on the substrate. For example, the substrate used herein may be selected from those described in the paragraph of the previous semiconductor light emitting device (including the crystal layer having the tilt crystal plane) of the present invention.

The crystal layer formed on the substrate has the S-plane tilted from the principal plane of the substrate or a plane substantially equivalent to the S-plane. The crystal layer may be any material layer insofar as alight emission region composed of the first conductive type layer, the active layer, and the second conductive type layer can be formed on planes parallel to the S-plane or a plane substantially equivalent to the S-plane of the material layer. For example, the material layer as the crystal layer may be selected from those described in the paragraph of the previous semiconductor light emitting device of the present invention. The method of growing the crystal layer and an underlying growth layer formed for growing the crystal layer may be also the same as those described in the paragraph of the previous semiconductor light emitting device of the present invention. It is to be noted that a plane equivalent to the S-plane includes a plane tilted from the S-plane by an angle of 5 to 6 degrees.

According to the present invention, a selective growth process can be used for forming the S-plane or a plane substantially equivalent to the S-plane. The S-plane is a stable plane selectively grown on the $C^+$-plane and is therefore relatively obtainable. The S-plane is expressed by the (1-101) plane in accordance with Miller indices of a hexagonal crystal system. Just as the C-plane includes the $C^+$-plane and the $C^-$-plane, the S-plane includes the $S^+$-plane and the $S^-$-plane. In this embodiment, the $S^+$-plane is grown on the $C^+$-plane of GaN, and it is referred to as the S-plane unless otherwise stated.

The semiconductor light emitting device of the present invention has a structure having the S-plane or a plane substantially equivalent to the S-plane. In particular, the crystal layer may have a structure in which the S-plane or a plane substantially equivalent to the S-plane constitutes a tilt plane of an approximately hexagonal pyramid shape. In other words, the crystal layer may be formed into a so-called approximately hexagonal truncated pyramid shape.

The above-described approximately hexagonal truncated pyramid shape is not necessarily an exact hexagonal truncated pyramid shape but may be an imperfect hexagonal truncated pyramid shape in which one or more faces thereof are lost. The ridge between adjacent two crystal plane portions of the crystal layer does not necessarily extend in a straight line. The approximately hexagonal pyramid shape and the approximately hexagonal truncated pyramid shape may extend in a straight line. The concrete selective growth process may be the same as that described in the paragraph of the previous semiconductor light emitting device of the present invention.

According to the semiconductor light emitting device of the present invention, the first conductive type layer, the active layer, and the second conductive type layer are formed on the crystal layer in such a manner as to extend within planes parallel to the S-plane or a plane substantially equivalent to the S-plane. The first conductive type layer, the active layer, and the second conductive type layer may be the same as those described in the paragraph of the previous semiconductor light emitting device of the present invention.

The first conductive type layer, the active layer, and the second conductive type layer can be easily formed on the crystal layer so as to extend within planes parallel to the S-plane or a plane substantially equivalent to the S-plane of the crystal layer by continuously forming these layers on the S-plane of the crystal layer by crystal growth. In other words, a light emission region composed of the first conductive type layer, the active layer, and the second conductive type layer can be formed partially or wholly on the S-plane.

In the case of forming a light emission region on a plane parallel to the principal plane of the substrate, light emitted from the light emission region is decayed by multiple reflection, whereas in the case of forming a light emission region on the tilt S-plane tilted from the principal plane of the substrate, light emitted from the light emission region can be emerged to the outside of the light emitting semiconductor device without occurrence of multiple reflection.

The first conductive type layer functioning as the cladding layer can be made from the same material as that of the crystal layer so as to have the same conductive type as that of the crystal layer. To be more specific, the first conductive type layer can be formed by continuing, after the crystal layer having the S-plane is formed, the crystal growth while continuously adjusting the concentration of the source gas. Alternatively, the first conductive type layer may be configured as part of the crystal layer having the S-plane.

According to the semiconductor light emitting device in this embodiment, the luminous efficiency can be increased by making use of a desirable crystallinity of the tilt S-plane of the crystal layer. By injecting a current only into the S-plane having a desirable crystallinity, it is possible to enhance the luminous efficiency. This is because the InGaN active layer can be desirably formed on the S-plane having a desirable crystallinity. In addition, the actual area of the active layer extending within a plane being substantially parallel to the S-plane is larger than the area, projected on the principal plane of the substrate or the underlying growth layer, of the active layer. The enlarged area of the active layer makes it possible to increase the area of the light emission region of the device and thereby reduce the density of a current injected in the light emission region, and to reduce the saturated luminance and thereby increase the luminous efficiency.

An electrode is formed on each of the crystal layer and the second conductive type layer. To reduce the contact resistance, a contact layer may be formed and then the electrode be formed thereon. In the case of forming these electrodes by vapor deposition, if the p-electrode and the n-electrode adhere on both the crystal layer and the crystal seed layer formed under the mask layer, there occurs short-circuit therebetween. To cope with such an inconvenience, each of the electrodes must be accurately formed by vapor deposition.

An image display unit or an illumination unit can be fabricated by arraying a plurality of the semiconductor light emitting devices according to the present invention. In this case, according to the semiconductor light emitting device of the present invention, the electrode area can be suppressed by making use of the S-plane, and accordingly, by preparing the semiconductor light emitting devices of three primary colors and arraying them in a scannable manner, an image display unit with a reduced electrode area can be realized.

The present invention will be hereinafter described in more detail with reference to embodiments. It is to be noted that the semiconductor light emitting device of the present invention is not limited to that described below but may be suitably changed without departing from the scope of the present invention.

<Embodiment 1>

Figure 2:
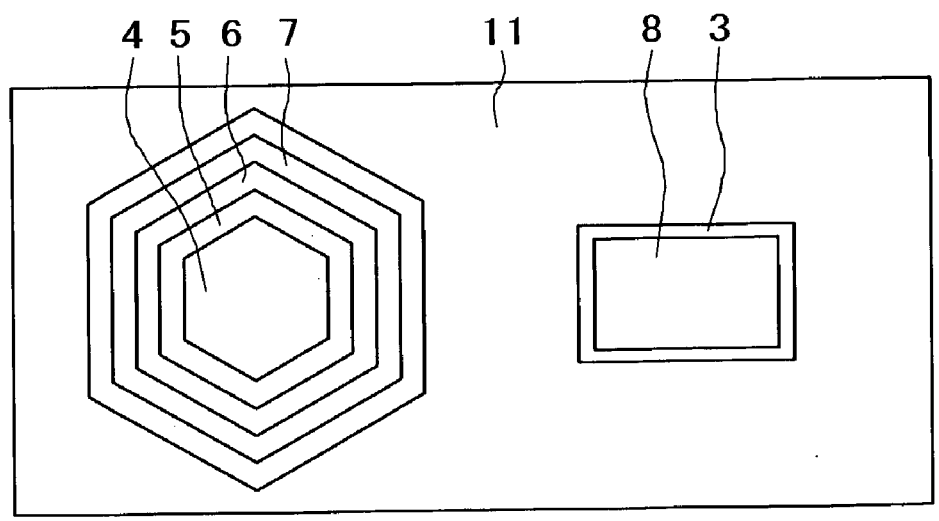
FIG. 2 is a top view of an approximately hexagonal pyramid portion of the semiconductor light emitting device according to the first embodiment.

A semiconductor light emitting device according to this embodiment has a device structure shown in FIGS. 1 and 2.

A GaN layer 2 is formed on a sapphire substrate 1 with the $C^+$-plane taken as the principal plane of the substrate, and a silicon-doped GaN layer 3 as a crystal seed layer is formed on the GaN layer 2. A silicon-doped GaN layer 4 as a crystal layer is formed by selective growth on the silicon-doped GaN layer 3 via a mask layer formed on the silicon-doped GaN layer 3. The silicon-doped GaN layer 4 has the S-plane tilted from the principal plane of the substrate. An InGaN layer 5 is formed as an active layer on the silicon-doped GaN layer 4 in such a manner as to extend in parallel to the S-plane, and a magnesium-doped GaN layer 6 is formed as a cladding layer on the InGaN layer 5. A p-electrode 7 is formed on the upper surface of the magnesium-doped GaN layer 6, and an n-electrode 8 is formed in an opening region, on one side of the stacked structure, of the mask layer in such a manner as to be connected to the silicon-doped GaN layer 4 via the silicon-doped GaN layer 3.

The stacked structure composed of the silicon-doped GaN layer 4, the InGaN layer 5, and the magnesium-doped GaN layer 6 has an approximately hexagonal pyramid shape. The apex and its vicinity of the stacked structure are cut along the C-plane or a plane substantially equivalent thereto, with a result that the upper plane of the stacked structure becomes the C-plane or a plane substantially equivalent thereto. In this way, the semiconductor light emitting device according to this embodiment has a so-called approximately hexagonal truncated pyramid shape. The device is then covered with a protective film 9 made from, for example, $SiO_2$.

The semiconductor light emitting device having such a structure is advantageous in that since the crystal growth of GaN and InGaN is performed by using the S-plane tilted from the principal plane of the sapphire substrate 1, the number of bonds from nitrogen atoms to gallium atoms in each of GaN and InGaN is increased, so that it is possible to increase an effective V/III ratio and hence to enhance the performance of the semiconductor light emitting device, and that since the S-plane is different from the principal plane ($C^+$-plane) of the sapphire substrate 1, dislocations extending upwardly from the sapphire substrate 1 may be bent, to reduce crystal defects of the device.

In a semiconductor light emitting device having an ordinary hexagonal pyramid shape, if threading dislocations extend from a substrate to the apex and its vicinity and/or the upper surface or its vicinity of the hexagonal pyramid shape, leakage of current may occur due to the threading dislocations, to reduce the luminous efficiency. Also, in such a semiconductor light emitting device, since the apex and its vicinity and/or the upper surface and its vicinity of the hexagonal pyramid shape are surrounded by the tilt side plane composed of the facet where the growth rate is low, the supply of the source gas at the apex and its vicinity and/or the upper surface and its vicinity becomes too large, to degrade the crystallinity of the apex and its vicinity and/or the upper surface and its vicinity, with a result that leakage of current may occur, to reduce the luminous efficiency of the device.

On the contrary, according to the semiconductor light emitting device in this embodiment, the device has a so-called approximately hexagonal truncated pyramid shape. Concretely, the silicon-doped GaN layer 4 is first formed into an approximately hexagonal pyramid shape, and is then subjected to an apex removal treatment. In this treatment, the apex and its vicinity of the approximately hexagonal pyramid shape are removed. As a result, treading dislocations extending from the substrate to the apex and its vicinity of the approximately hexagonal pyramid shaped silicon-doped GaN layer 4 are removed. Also, since the apex and its vicinity and/or the upper surface and its vicinity, in which crystallinity is poor, of the approximately hexagonal pyramid shaped silicon-doped GaN layer 4 are removed, the crystallinity of the remaining approximately hexagonal truncated pyramid shaped silicon-doped GaN layer 4 is excellent.

As a result, according to the semiconductor light emitting device in this embodiment, it is possible to prevent occurrence of leakage of current due to treading dislocations and poor crystallinity in the apex and its vicinity and/or the upper surface and its vicinity, and hence to prevent the luminous efficiency from being reduced by leakage of current; and since crystal growth is performed by using the tilt crystal plane tilted from the principal plane of the substrate, it is possible prevent occurrence of multiple reflection of light emission, and hence to efficiently emerge light from a light emission region to the outside of the device. In this way, the semiconductor light emitting device in this embodiment described above makes it possible to realize an excellent luminous efficiency and a high luminance.

A method of fabricating the semiconductor light emitting device having the above-described structure will be described with reference to fabrication steps shown in FIGS. 3 to 14.

Figure 3:
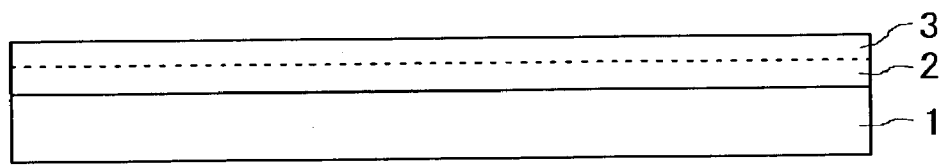
FIG. 3 is a sectional view illustrating a step of fabricating the semiconductor light emitting device according to the first embodiment, showing a state that a GaN layer and a silicon-doped GaN layer are formed.

As shown in FIG. 3, a GaN layer 2 is formed as a buffer layer on a sapphire substrate 1 with the $C^+$-plane taken as the principal plane of the substrate at a low temperature of about 500° C., and then the growth temperature is raised to 1000° C., at which a silicon-doped GaN layer 3 is formed on the GaN layer 2.

Figure 4:
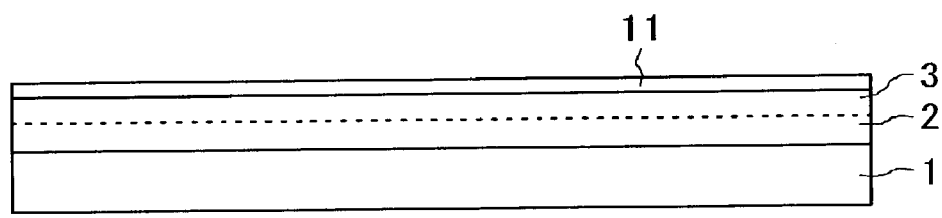
FIG. 4 is a sectional view illustrating a step of fabricating the semiconductor light emitting device according to the first embodiment, showing a state that a mask layer is formed.
Figure 5:
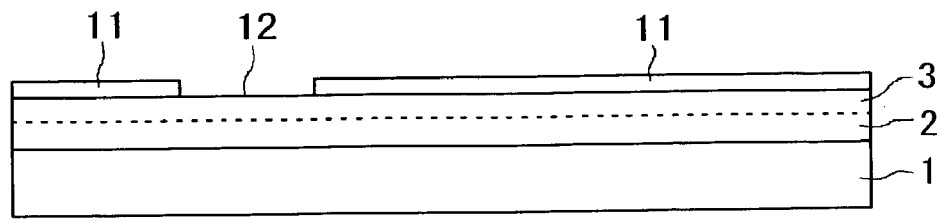
FIG. 5 is a sectional view illustrating a step of fabricating the semiconductor light emitting device according to the first embodiment, showing a state that a window region is formed.

As shown in FIG. 4, a mask layer 11 made from $SiO_2$ or SiN is formed overall on the silicon-doped GaN layer 3 to a thickness ranging from 100 to 500 nm, and as shown in FIG. 5, a window region 12 composed of a circular opening having a diameter of about 10 μm is formed in the mask layer 11 by photolithography and etching using a hydrofluoric acid based etchant. It is to be noted that the size of the opening may be changed depending on characteristics of a device to be fabricated.

Figure 6:
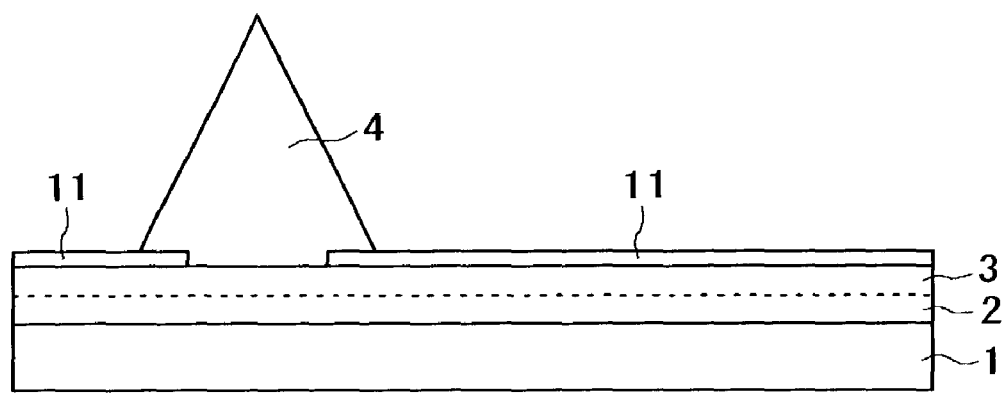
FIG. 6 is a sectional view illustrating a step of fabricating the semiconductor light emitting device according to the first embodiment, showing a state that a silicon-doped GaN layer is formed.

A silicon-doped GaN layer 4 is formed by crystal growth at a growth temperature of 1000° C. With respect to crystal growth of the silicon-doped GaN layer 4, the crystal growth begins from the circular window region 12, and after an elapse of certain time, the crystal grown from the window region 12 becomes a hexagonal pyramid shape surrounded by the S-plane, that is, the (1-101) plane. After the crystal exhibits a hexagonal pyramid shape, the crystal growth is further continued until the crystal becomes a hexagonal pyramid shape of a size having a width of about 20 μm (length of one side: about 10 μm) and a height of about 16 μm (about 1.6 times the length of one side). As shown in FIG. 6, the silicon-doped GaN layer 4 with its bottom surface extended outwardly from the window region 12 is thus formed. To be more specific, with reference to FIG. 6 which shows the cross-section of the silicon-doped GaN layer 4, while the diameter of the opening is 10 μm, the length of the bottom side of the triangular cross-section of the silicon-doped GaN layer 4 becomes about 16 μm.

It is to be noted that the size, that is, the width of the hexagonal pyramid shape of the silicon-doped GaN layer 4 is not limited to about 20 μm as described above but may be set to another value, for example, about 10 μm, and that only one silicon-doped GaN layer 4 is shown in FIG. 6; however, in actual, a number of silicon-doped GaN layer 4 can be formed overall on the principal plane of the sapphire substrate 1 for efficiently forming a semiconductor light emitting device.

Figure 7:
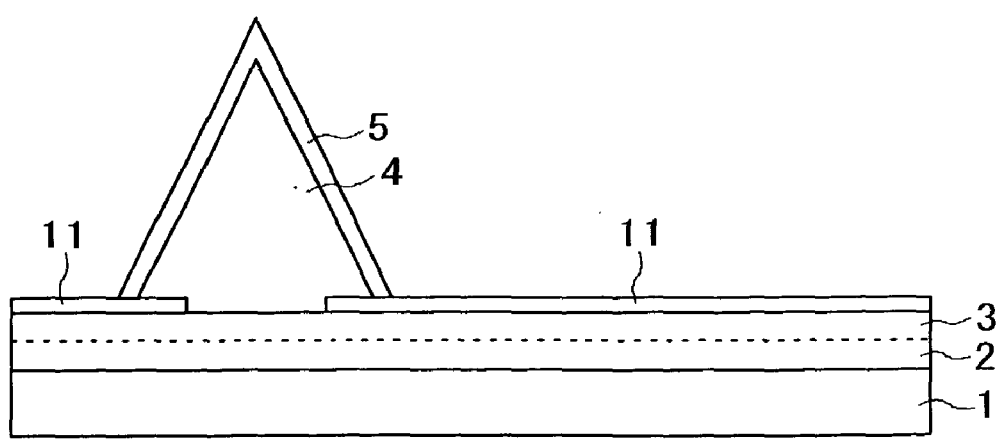
FIG. 7 is a sectional view illustrating a step of fabricating the semiconductor light emitting device according to the first embodiment, showing a state that an InGaN layer is formed.
Figure 8:
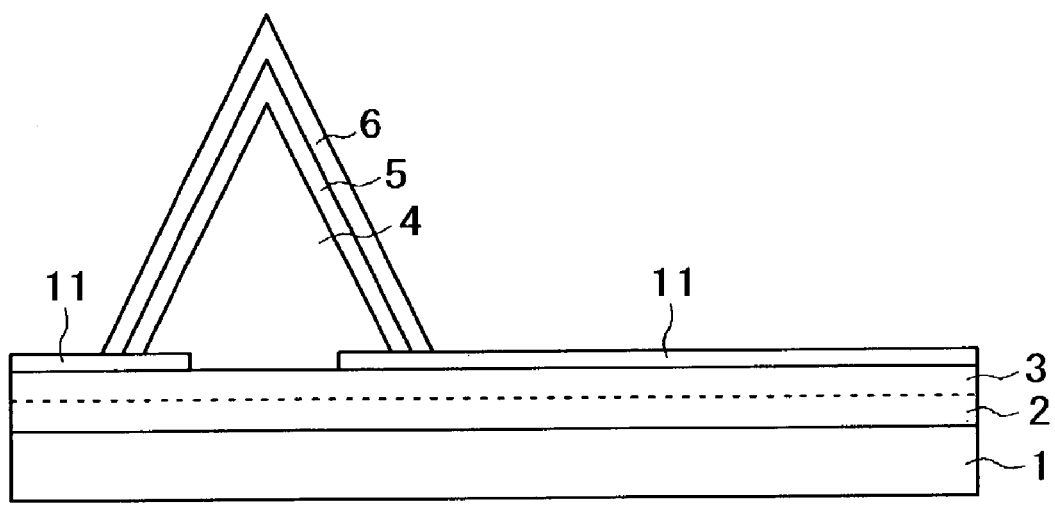
FIG. 8 is a sectional view illustrating a step of fabricating the semiconductor light emitting device according to the first embodiment, showing a state that a magnesium-doped GaN layer is formed.

After the silicon-doped GaN layer 4 is further grown, the growth temperature is lowered, and as shown in FIG. 7, an InGaN layer 5 as an active layer is grown on the GaN layer 4. After that, the growth temperature is raised again, and as shown in FIG. 8, a magnesium-doped GaN layer 6 as a p-type cladding layer is grown on the InGaN layer 5. The thickness of the InGaN layer 5 is in a range of about 0.5 nm to 3 nm. The active layer may be configured as a quantum well layer or a multi-quantum well layer of (Al)GaN/InGaN, or a multiple structure using GaN or InGaN functioning as a guide layer. In this case, it is preferred to grow an AlGaN layer directly on an InGaN layer. In this stage, the InGaN layer 5 and the magnesium-doped GaN layer 6 are grown so as to extend on a portion, around the window region 12, of the mask layer 11, that is, to cover the whole of the silicon-doped GaN layer 4 as the second growth layer. Accordingly, end portions of the InGaN layer 5 as the active layer and the magnesium-doped GaN layer 6 are not formed on the silicon-doped GaN layer 4, so that it is possible to prevent degradation of the active layer.

Figure 9:
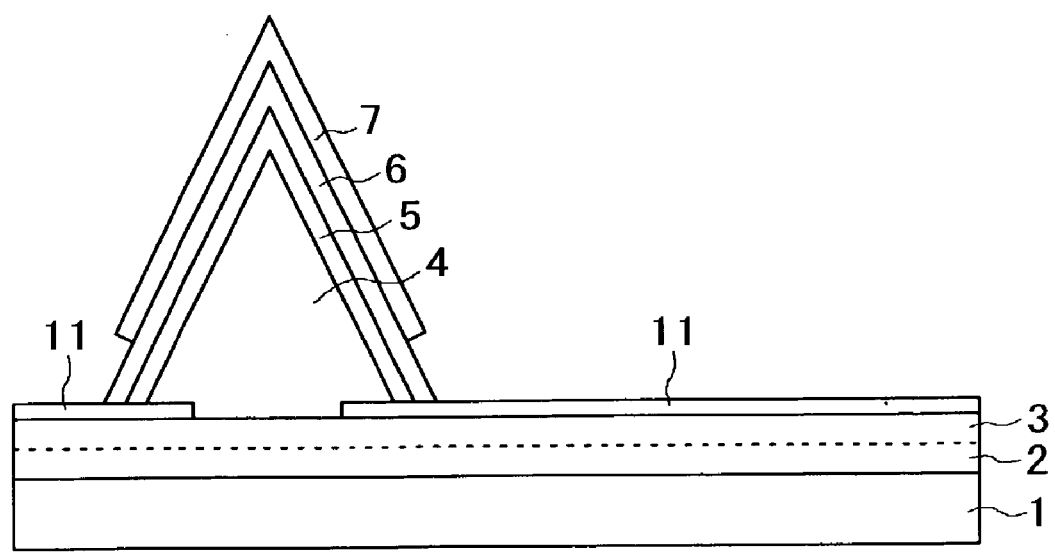
FIG. 9 is a sectional view illustrating a step of fabricating the semiconductor light emitting device according to the first embodiment, showing a state that a p-electrode is formed.
Figure 10:
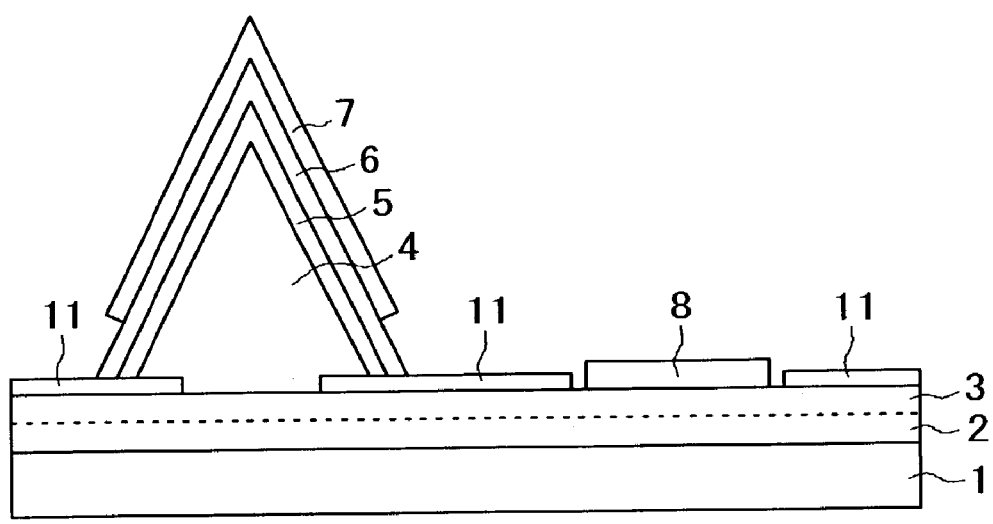
FIG. 10 is a sectional view illustrating a step of fabricating the semiconductor light emitting device according to the first embodiment, showing a state that an n-electrode is formed.

As shown in FIG. 9, a metal material Ni/Pt/Au or Ni(Pd)/Pt/Au is vapor-deposited on the uppermost surface of the hexagonal pyramid shaped structure, to form a p-electrode 7. As shown in FIG. 10, a portion of the mask layer 11 is opened to expose the silicon-doped GaN layer 3, and a metal material Ti/Al/Pt/Au is vapor-deposited on the exposed portion of the silicon-doped GaN layer 3, to form an n-electrode 8. In this electrode forming step, it is required to accurately form the p-electrode 7 and the n-electrode 8 by vapor-deposition.

Figure 11:
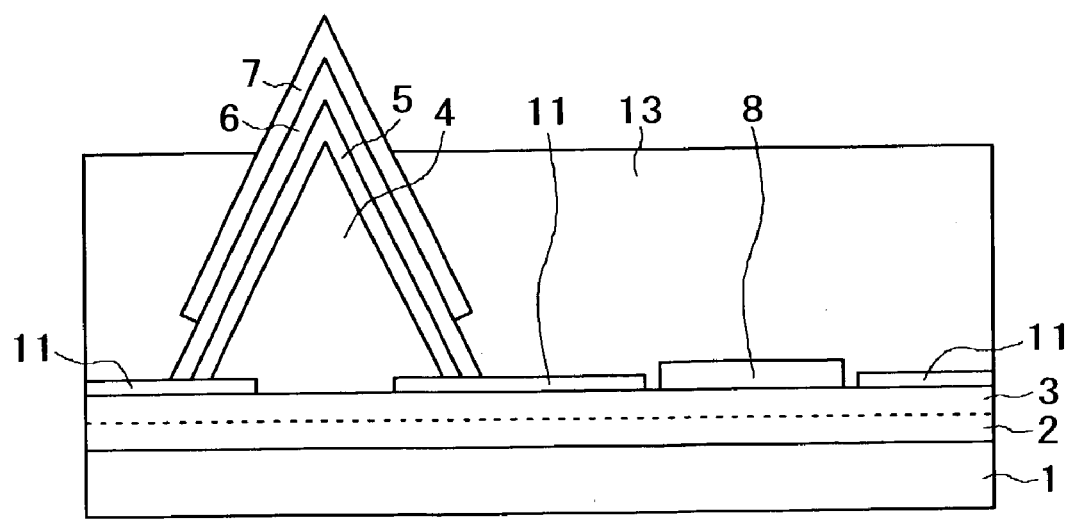
FIG. 11 is a sectional view illustrating a step of fabricating the semiconductor light emitting device according to the first embodiment, showing a state that a stacked layer structure is buried in a resin.

As shown in FIG. 11, the whole of the hexagonal pyramid shaped stacked structure is buried with a resin 13 such as polyimide. The resin 13 is not particularly limited and may be any other known resin without departing from the scope of the present invention. In this step, the height of the resin 13 is set to that of about the apex or its vicinity of the approximately hexagonal pyramid shaped silicon-doped GaN layer 4.

Figure 12:
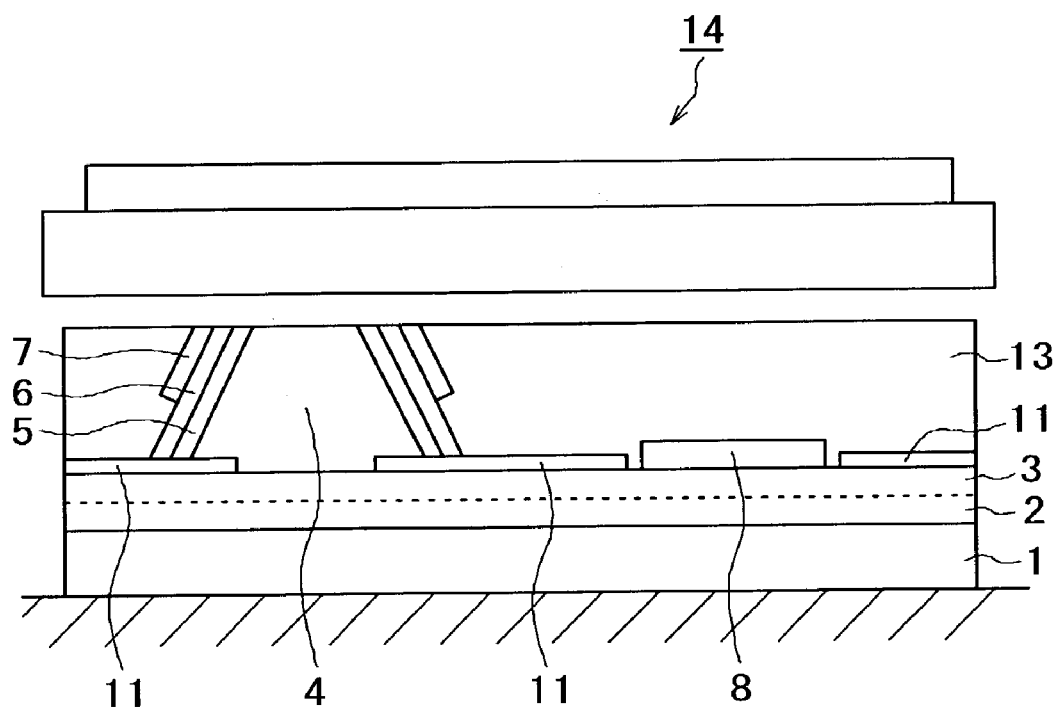
FIG. 12 is a sectional view illustrating a step of fabricating the semiconductor light emitting device according to the first embodiment, showing a state that the stacked layer structure becomes a so-called approximately hexagonal truncated pyramid shape by CMP.

As shown in FIG. 12, a portion, ranging from the apex or its vicinity to an approximately mid point, of the approximately hexagonal pyramid shaped stacked structure is cut off by using a chemical mechanical polishing (CMP) apparatus 14. As a result, the stacked structure becomes a so-called approximately hexagonal truncated pyramid shape. It is to be noted that the height of the stacked structure after CMP is required to be set to such a value that the apex and its vicinity of the silicon-doped GaN layer 4 are certainly cut off.

Accordingly, the approximately hexagonal truncated pyramid shaped silicon-doped GaN layer 4 thus formed by CMP does not contain threading dislocations having been present so as to extend from the sapphire substrate 1 to the apex and its vicinity of the approximately hexagonal pyramid silicon-doped GaN layer 4 in the state before CMP, and also does not contain a portion whose crystallinity is poor because the apex and its vicinity, in which crystallinity is poor, of the approximately hexagonal pyramid silicon-doped GaN layer 4 have been removed by CMP. Namely, the crystallinity of the remaining approximately hexagonal truncated pyramid shaped silicon-doped GaN layer 4 is excellent. As a result, it is possible to prevent occurrence of leakage of current due to threading dislocations and poor crystallinity at the apex or in the apex and its vicinity and hence to prevent the luminous efficiency from being reduced due to leakage of current.

It is to be noted that this effect obtained by the approximately hexagonal truncated pyramid shape applies in the following embodiments.

Figure 13:
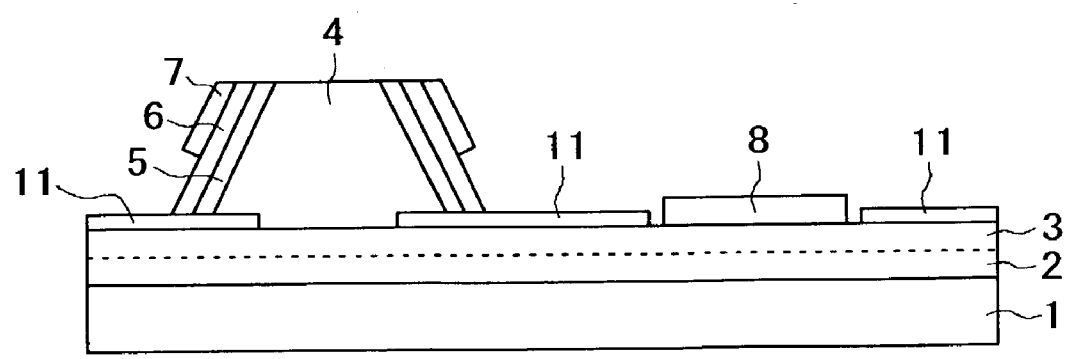
FIG. 13 is a sectional view illustrating a step of fabricating the semiconductor light emitting device according to the first embodiment, showing a state that the resin is removed.

The resin 13 is removed as shown in FIG. 13, and then the whole of the device structure is covered with a protective film 9 made from SiO$_2$ or the like as shown in FIG. 14. If necessary, an insulating film may be formed. After that, the device structure is separated into individual semiconductor light emitting devices by RIE (Reactive Ion Etching) or by using a dicer. The semiconductor light emitting device according to this embodiment is thus accomplished.

<Embodiment 2>

In this embodiment, another method of fabricating the semiconductor light emitting device shown in FIGS. 1 and 2 will be described.

First, a stacked structure is formed and is then buried with a resin 13 as shown in FIG. 15 in accordance with the above-described steps shown in FIGS. 3 to 11. In this burying step, the height of the resin 13 is set to that of an approximately mid point of a p-electrode 7.

Figure 16:
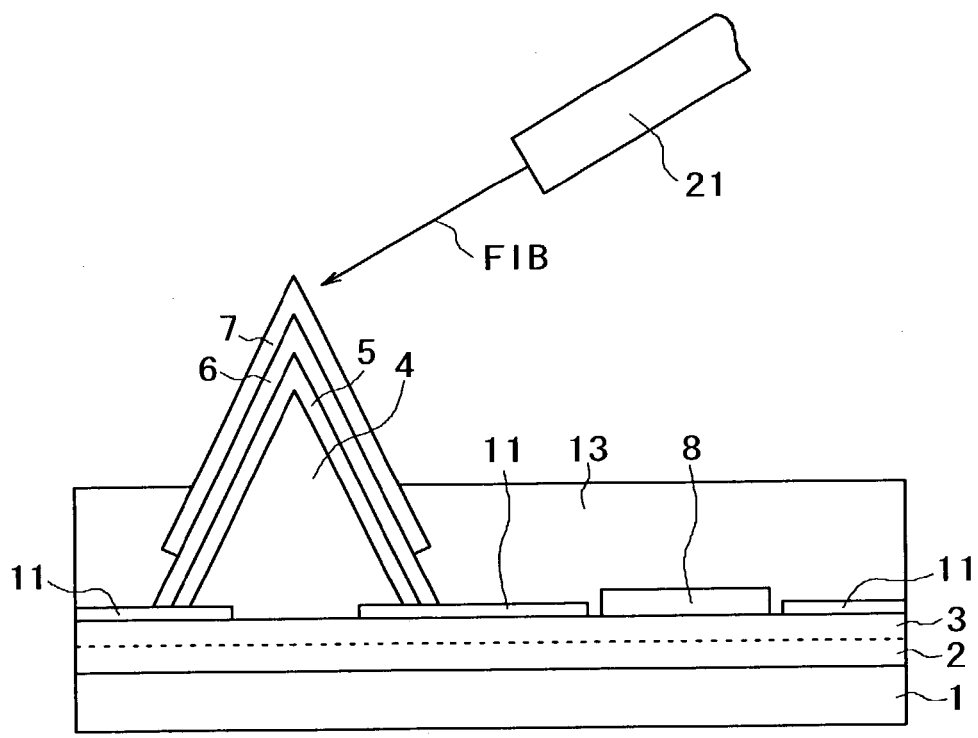
FIG. 16 is a sectional view illustrating a step of fabricating the semiconductor light emitting device according to the second embodiment, showing a state that the apex and its vicinity of the stacked layer structure are irradiated by FIB.
Figure 17:
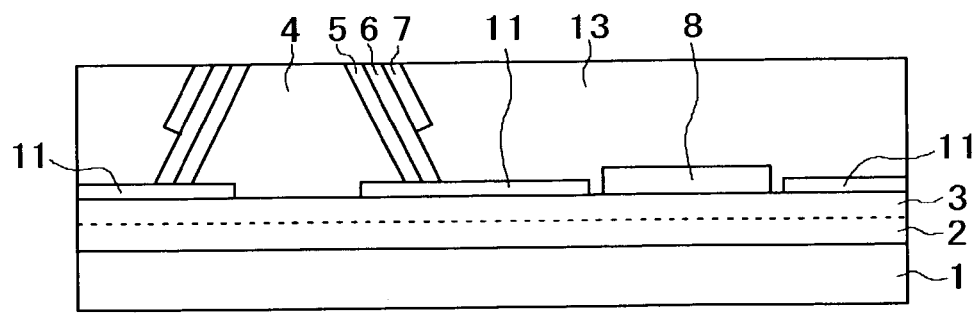
FIG. 17 is a sectional view illustrating a step of fabricating the semiconductor light emitting device according to the second embodiment, showing a state that the stacked layer structure becomes a so-called approximately hexagonal truncated pyramid shape by irradiation of FIB.

As shown in FIG. 16, the apex and its vicinity of the approximately hexagonal pyramid shaped stacked structure are irradiated with ion beams by a focused ion beam (hereinafter, referred to as "FIB") apparatus 21, whereby a portion, ranging from the apex and its vicinity to an approximately mid point, of the approximately hexagonal pyramid shape, is cut off as shown in FIG. 17. As a result, the stacked structure becomes a so-called approximately hexagonal truncated pyramid shape. It is to be noted that the height of the stacked structure after FIB irradiation treatment is required to be set to such a value that the apex and its vicinity of the silicon-doped GaN layer 4 are certainly removed.

Accordingly, the approximately hexagonal truncated pyramid shaped silicon-doped GaN layer 4 thus formed by FIB irradiation does not contain threading dislocations having been present so as to extend from the sapphire substrate 1 to the apex and its vicinity of the approximately hexagonal pyramid silicon-doped GaN layer 4 in the state before FIB irradiation, and also does not contain a portion whose crystallinity is poor because the apex and its vicinity, in which crystallinity is poor, of the approximately hexagonal pyramid silicon-doped GaN layer 4 have been removed by FIB irradiation. Namely, the crystallinity of the remaining approximately hexagonal truncated pyramid shaped silicon-doped GaN layer 4 is excellent. As a result, it is possible to prevent occurrence of leakage of current due to threading dislocations and poor crystallinity at the apex or in the apex and its vicinity and hence to prevent the luminous efficiency from being reduced due to leakage of current.

Figure 18:
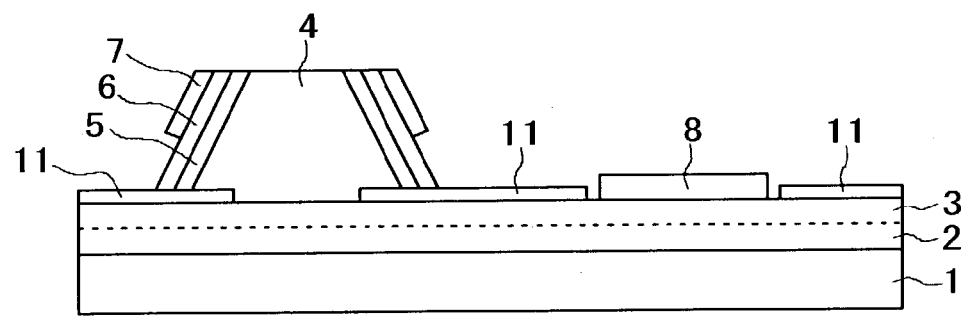
FIG. 18 is a sectional view illustrating a step of fabricating the semiconductor light emitting device according to the second embodiment, showing a state that the resin is removed.
Figure 19:
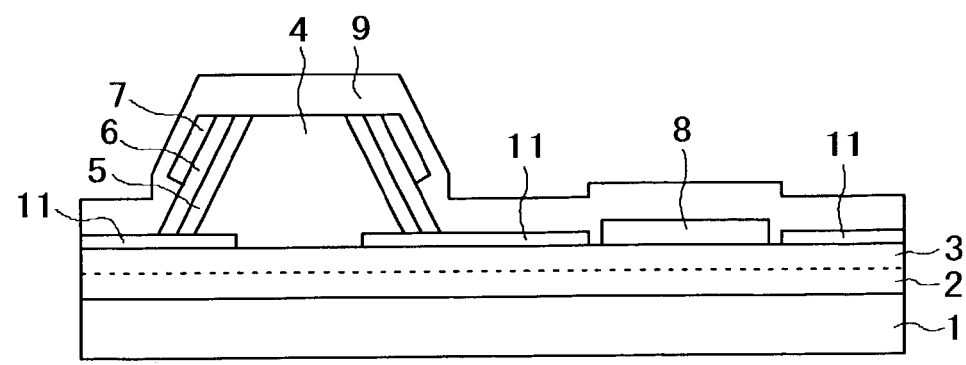
FIG. 19 is a sectional view illustrating a step of fabricating the semiconductor light emitting device according to the second embodiment, showing a state that an insulating layer is formed.

The resin 13 is removed as shown in FIG. 18, and then the whole of the device structure is covered with a protective film 9 made from $SiO_2$ or the like as shown in FIG. 19. The device structure is then separated into individual semiconductor light emitting devices by RIE (Reactive Ion Etching) or by using a dicer. The semiconductor light emitting device shown in FIGS. 1 and 2 is thus accomplished.

<Embodiment 3>

In this embodiment, a further method of fabricating the semiconductor light emitting device shown in FIGS. 1 and 2 will be described.

Figure 20:
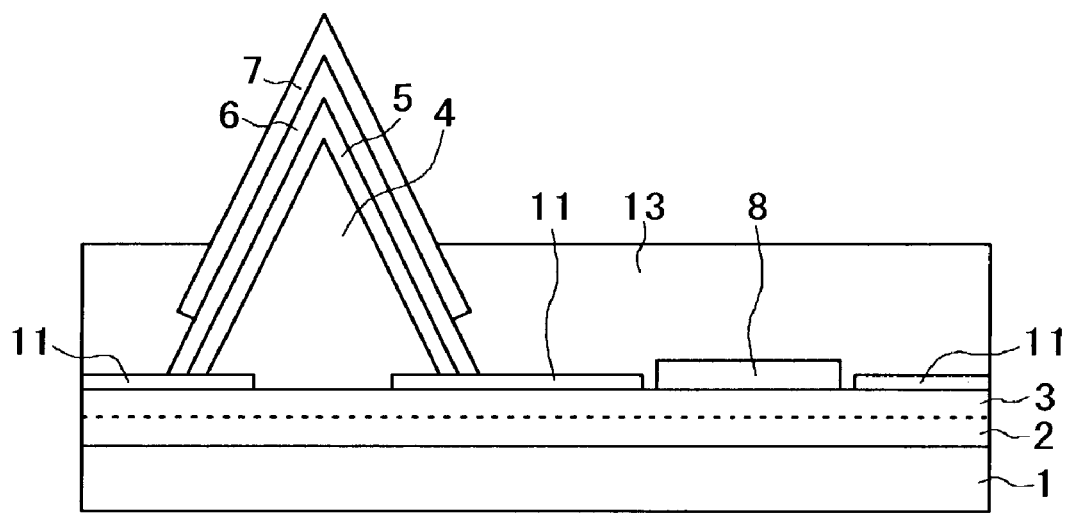
FIG. 20 is a sectional view illustrating a step of fabricating a semiconductor light emitting device according to a third embodiment, showing a state that a stacked layer structure is buried in a resin.

First, a stacked structure is formed and is then buried with a resin 13 as shown in FIG. 20 in accordance with the above-described steps shown in FIGS. 3 to 11. In this burying step, the height of the resin 13 is set to that of an approximately mid point of a p-electrode 7.

Figure 21:
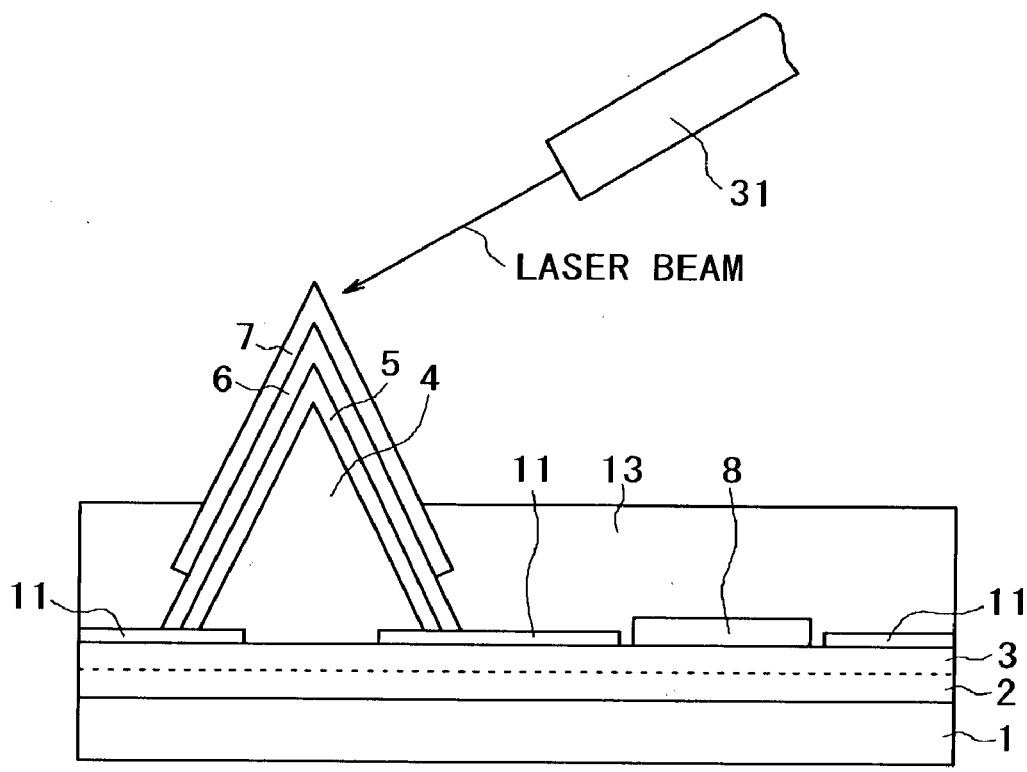
FIG. 21 is a sectional view illustrating a step of fabricating the semiconductor light emitting device according to the third embodiment, showing a state that the apex and its vicinity of the stacked layer structure are irradiated by laser beams.
Figure 22:
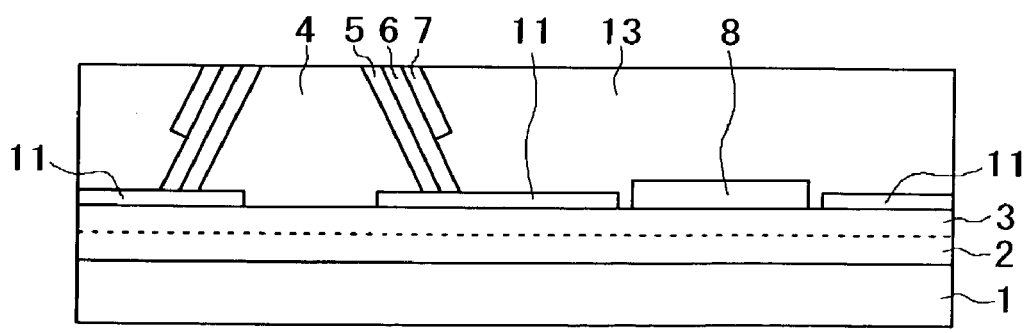
FIG. 22 is a sectional view illustrating a step of fabricating the semiconductor light emitting device according to the third embodiment, showing a state that the stacked layer structure becomes a so-called approximately hexagonal truncated pyramid shape by irradiation of laser beams.

As shown in FIG. 21, the apex and its vicinity of the approximately hexagonal pyramid shaped stacked structure are irradiated with laser beams by a laser apparatus 31, whereby a portion, ranging from the apex and its vicinity to an approximately mid point, of the approximately hexagonal pyramid shape, is cut off as shown in FIG. 22. As a result, the stacked structure becomes a so-called approximately hexagonal truncated pyramid shape. It is to be noted that the height of the stacked structure after laser irradiation treatment is required to be set to such a value that the apex and its vicinity of the silicon-doped GaN layer 4 are certainly removed.

Accordingly, the approximately hexagonal truncated pyramid shaped silicon-doped GaN layer 4 thus formed by laser irradiation does not contain threading dislocations having been present so as to extend from the sapphire substrate 1 to the apex and its vicinity of the approximately hexagonal pyramid silicon-doped GaN layer 4 in the state before laser irradiation, and also does not contain a portion whose crystallinity is poor because the apex and its vicinity, in which crystallinity is poor, of the approximately hexagonal pyramid silicon-doped GaN layer 4 have been removed by laser irradiation. Namely, the crystallinity of the remaining approximately hexagonal truncated pyramid shaped silicon-doped GaN layer 4 is excellent. As a result, it is possible to prevent occurrence of leakage of current due to threading dislocations and poor crystallinity at the apex or in the apex and its vicinity and hence to prevent the luminous efficiency from being reduced due to leakage of current.

It is to be noted that the kind of laser beams is not particularly limited but may be variously selected insofar as the silicon-doped GaN layer 4, the InGaN layer 5, and the magnesium-doped GaN layer 6 can be certainly removed by irradiation of the laser beams.

Figure 23:
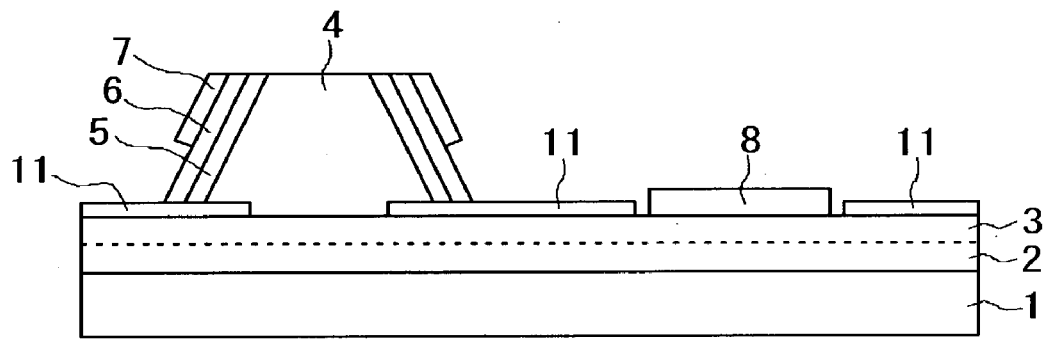
FIG. 23 is a sectional view illustrating a step of fabricating the semiconductor light emitting device according to the third embodiment, showing a state that the resin is removed.
Figure 24:
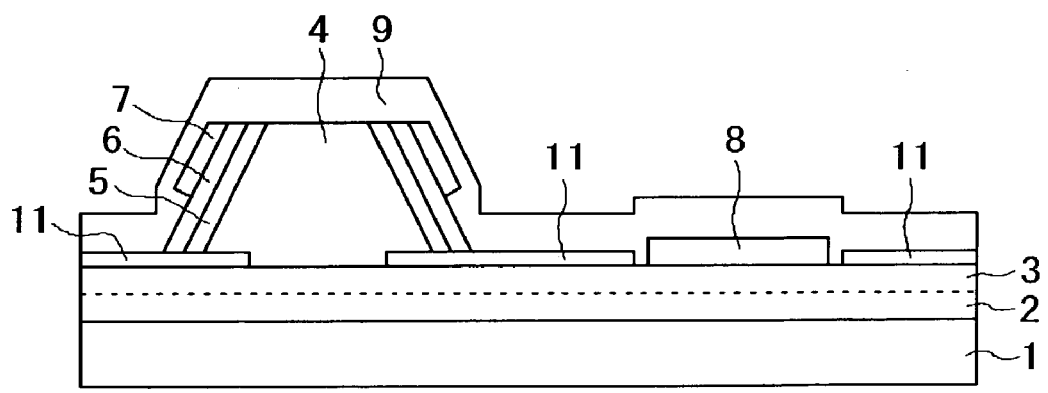
FIG. 24 is a sectional view illustrating a step of fabricating the semiconductor light emitting device according to the third embodiment, showing a state that an insulating layer is formed.

The resin 13 is removed as shown in FIG. 23, and then the whole of the device structure is covered with a protective film 9 made from $SiO_2$ or the like as shown in FIG. 24. The device structure is then separated into individual semiconductor light emitting devices by RIE (Reactive Ion Etching) or by using a dicer. The semiconductor light emitting device shown in FIGS. 1 and 2 is thus accomplished.

<Embodiment 4>

In this embodiment, a further method of fabricating the semiconductor light emitting device shown in FIGS. 1 and 2 will be described.

Figure 25:
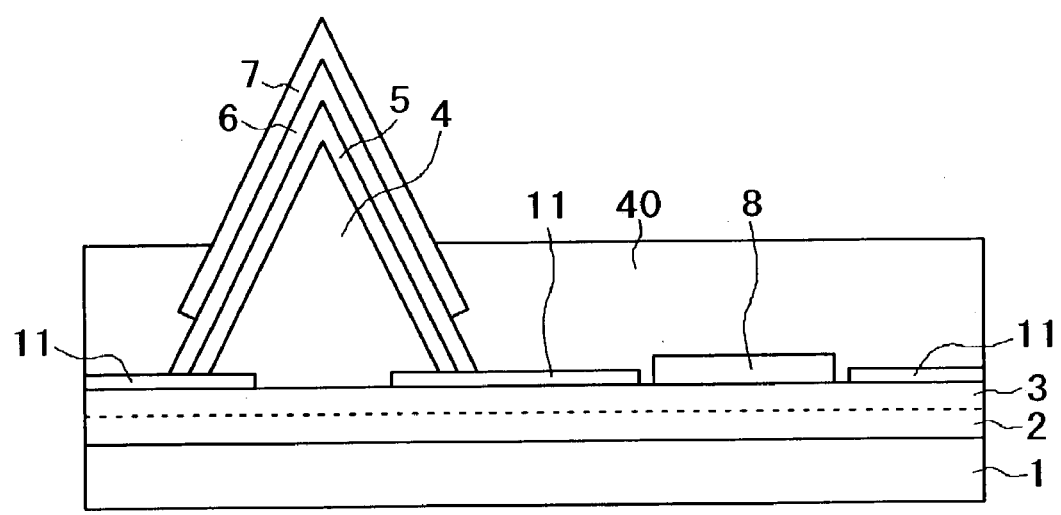
FIG. 25 is a sectional view illustrating a step of fabricating a semiconductor light emitting device according to a fourth embodiment, showing a state that a stacked layer structure is buried in a resist.

First, a stacked structure is formed and is then buried with a resist 40 as shown in FIG. 25 in accordance with the above-described steps shown in FIGS. 3 to 11. In this burying step, the height of the resist 40 is set to that of an approximately mid point of a p-electrode 7.

Figure 27:
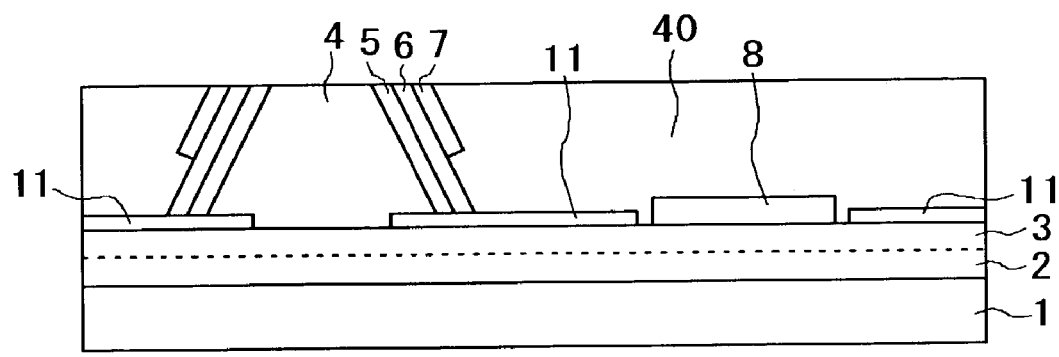
FIG. 27 is a sectional view illustrating a step of fabricating the semiconductor light emitting device according to the fourth embodiment, showing a state that the stacked layer structure becomes a so-called approximately hexagonal truncated pyramid shape by dry etching.

As shown in FIG. 26, the stacked structure is subjected to dry etching using the resist 40 as a mask, whereby a portion, ranging from the apex and its vicinity to an approximately mid point, of the approximately hexagonal pyramid shape, is cut off as shown in FIG. 27. As a result, the stacked structure becomes a so-called approximately hexagonal truncated pyramid shape. It is to be noted that the kind of an etching gas used for dry etching is not particularly limited but may be variously selected insofar as the silicon-doped GaN layer 4, the InGaN layer 5, and the magnesium-doped GaN layer 6 can be certainly removed by drying etching using the etching gas. For example, a chlorine based gas can be used as the etching gas. In addition, the height of the stacked structure after dry etching is required to be set to such a value that the apex and its vicinity of the silicon-doped GaN layer 4 are certainly removed.

Accordingly, the approximately hexagonal truncated pyramid shaped silicon-doped GaN layer 4 thus formed by dry etching does not contain threading dislocations having been present so as to extend from the sapphire substrate 1 to the apex and its vicinity of the approximately hexagonal pyramid silicon-doped GaN layer 4 in the state before dry etching, and also does not contain a portion whose crystallinity is poor because the apex and its vicinity, in which crystallinity is poor, of the approximately hexagonal pyramid silicon-doped GaN layer 4 have been removed by dry etching. Namely, the crystallinity of the remaining approximately hexagonal truncated pyramid shaped silicon-doped GaN layer 4 is excellent. As a result, it is possible to prevent occurrence of leakage of current due to threading dislocations and poor crystallinity at the apex or in the apex and its vicinity and hence to prevent the luminous efficiency from being reduced due to leakage of current.

Figure 28:
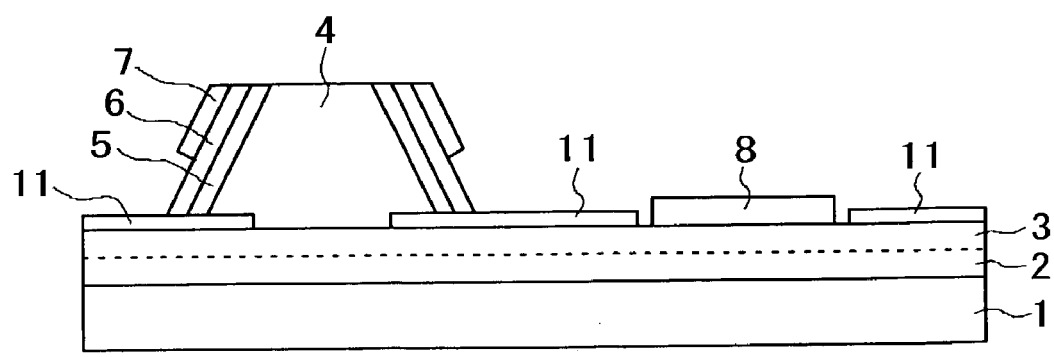
FIG. 28 is a sectional view illustrating a step of fabricating the semiconductor light emitting device according to the fourth embodiment, showing a state that the resist is removed.
Figure 29:
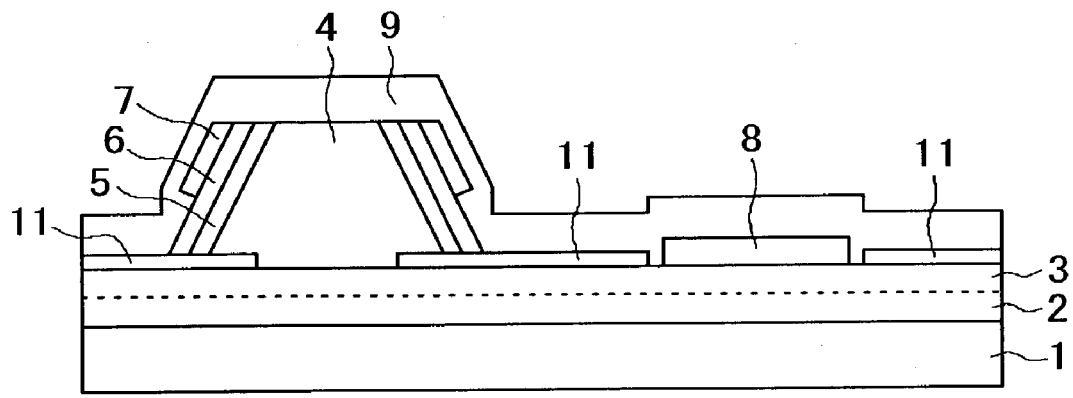
FIG. 29 is a sectional view illustrating a step of fabricating the semiconductor light emitting device according to the fourth embodiment, showing a state that an insulating layer is formed.

The resist 40 is removed as shown in FIG. 28, and then the whole of the device structure is covered with a protective film 9 made from $SiO_2$ as shown in FIG. 29. The device structure is then separated into individual semiconductor light emitting devices by RIE (Reactive Ion Etching) or by using a dicer. The semiconductor light emitting device shown in FIGS. 1 and 2 is thus accomplished.

<Embodiment 5>

In this embodiment, a semiconductor light emitting device in which an n-electrode is formed on a back surface of a substrate will be described with reference to FIGS. 30 to 36.

In this embodiment, to form an n-electrode on the back surface of a sapphire substrate 1, an n-electrode forming region is provided by removing part of the back surface of the sapphire substrate 1.

Steps from the initial step to the p-electrode 7 forming step are the same as those described in the first embodiment.

Figure 30:
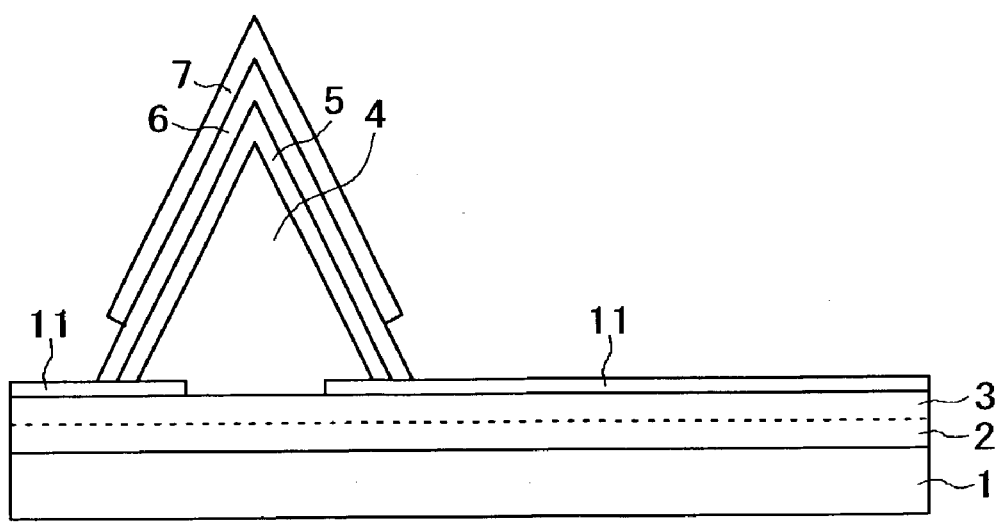
FIG. 30 is a sectional view illustrating a step of fabricating a semiconductor light emitting device according to a fifth embodiment, showing a state that a p-electrode is formed.
Figure 31:
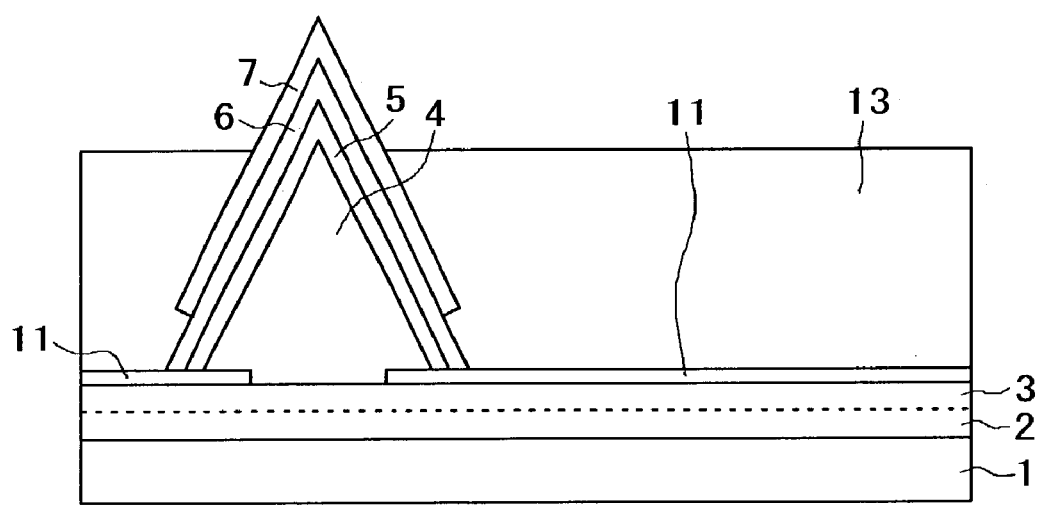
FIG. 31 is a sectional view illustrating a step of fabricating the semiconductor light emitting device according to the fifth embodiment, showing a state that a stacked layer structure is buried in a resin.

A stacked structure is formed and a p-electrode 7 is formed as shown in FIG. 30 in accordance with the above-described steps shown in FIGS. 3 to 9, and then the stacked structure is buried with a resin 13 as shown in FIG. 31.

Like the first embodiment, a portion, ranging from the apex and its vicinity to an approximately mid point, of the approximately hexagonal pyramid shape, is cut off by use of the CMP apparatus 14 as shown in FIG. 32. As a result, the stacked structure becomes a so-called approximately hexagonal truncated pyramid shape. It is to be noted that the height of the stacked structure after CMP is required to be set to such a value that the apex and its vicinity of the silicon-doped GaN layer 4 are certainly removed.

Accordingly, the approximately hexagonal truncated pyramid shaped silicon-doped GaN layer 4 thus formed by CMP does not contain threading dislocations having been present so as to extend from the sapphire substrate 1 to the apex and its vicinity of the approximately hexagonal pyramid silicon-doped GaN layer 4 in the state before CMP, and also does not contain a portion whose crystallinity is poor because the apex and its vicinity, in which crystallinity is poor, of the approximately hexagonal pyramid silicon-doped GaN layer 4 have been removed by CMP. Namely, the crystallinity of the remaining approximately hexagonal truncated pyramid shaped silicon-doped GaN layer 4 is excellent. As a result, it is possible to prevent occurrence of leakage of current due to threading dislocations and poor crystallinity at the apex or in the apex and its vicinity and hence to prevent the luminous efficiency from being reduced due to leakage of current.

Figure 34:
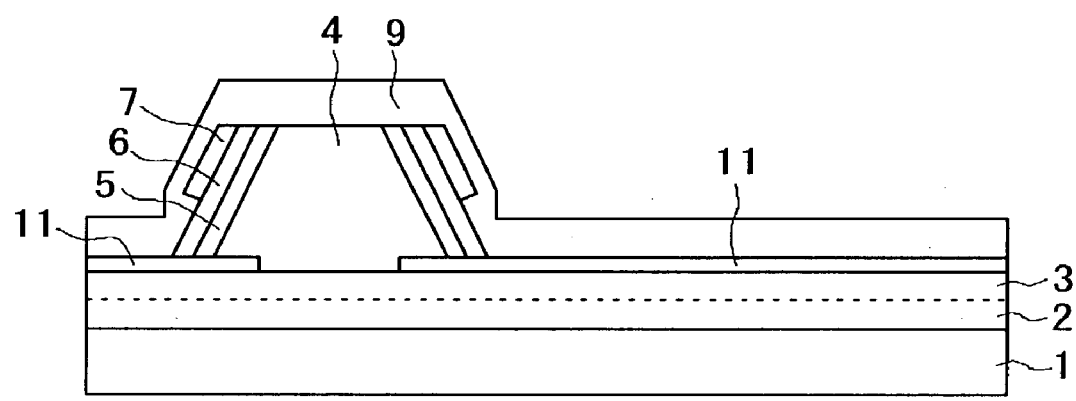
FIG. 34 is a sectional view illustrating a step of fabricating the semiconductor light emitting device according to the fifth embodiment, showing a state that an insulating layer is formed.

The resin 13 is removed as shown in FIG. 33, and then the whole of the device structure is covered with a protective film 9 made from $SiO_2$ as shown in FIG. 34.

Figure 35:
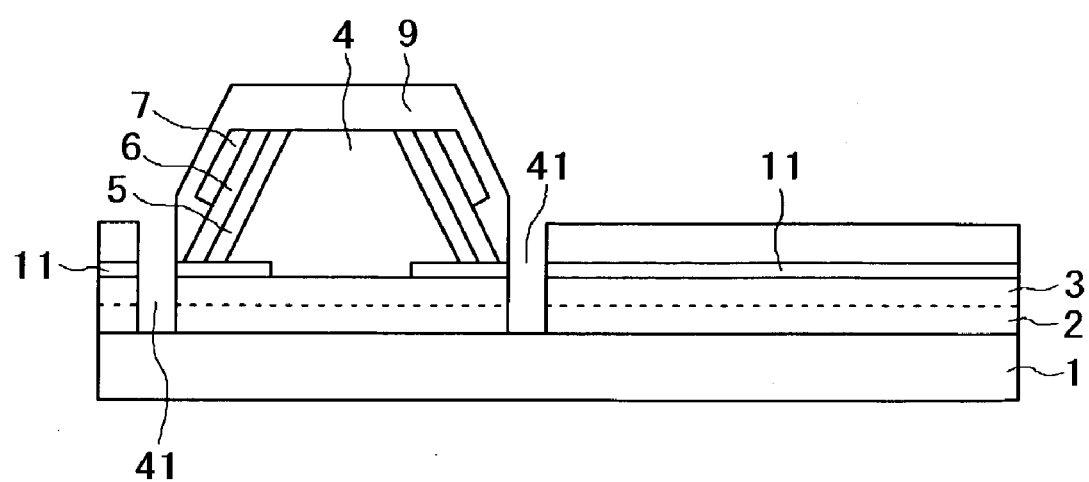
FIG. 35 is a sectional view illustrating a step of fabricating the semiconductor light emitting device according to the fifth embodiment, showing a state that isolation grooves are formed.

As shown in FIG. 35, isolation grooves 41 are formed in the device structure by RIE (Reactive Ion Etching) or by using a dicer, and the device structure is separated into individual devices on the sapphire substrate 1.

Figure 36:
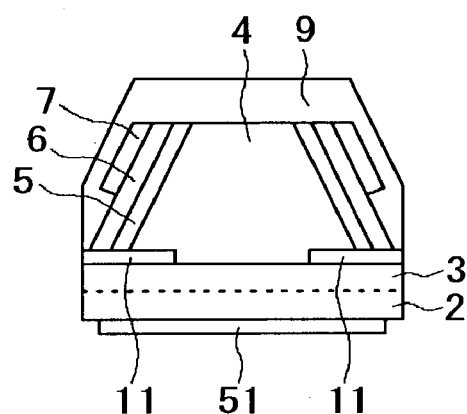
FIG. 36 is a sectional view illustrating a step of fabricating the semiconductor light emitting device according to the fifth embodiment, showing a state that an n-electrode is formed.

A boundary between each device and the sapphire substrate 1 is irradiated with excimer laser beams from the back surface of the sapphire substrate 1, whereby a device region including each device is peeled from the sapphire substrate 1 by laser abrasion and is transferred to a transfer substrate. In the state that the device is held on the transfer substrate, a metal material Ti/Al/Pt/Au is vapor-deposited on a back surface portion of the device, to form an n-electrode 51. In this way, a semiconductor light emitting device including the n-electrode 51 formed on the back surface thereof as shown in FIG. 36 is accomplished.

<Embodiment 6>

In this embodiment, a semiconductor light emitting device including an n-electrode directly formed on a silicon-doped GaN layer 4 will be described with reference to FIGS. 37 to 45.

Figure 37:
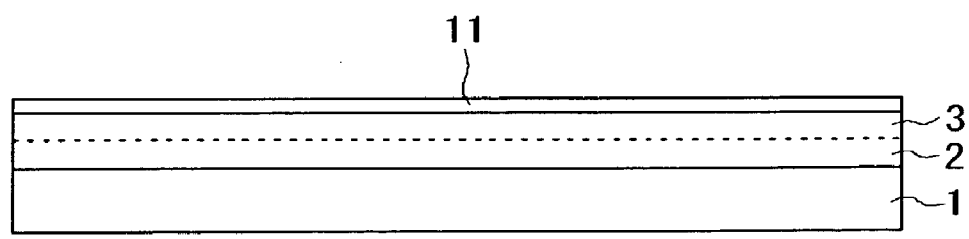
FIG. 37 is a sectional view illustrating a step of fabricating a semiconductor light emitting device according to a sixth embodiment, showing a state that a mask layer is formed.
Figure 38:
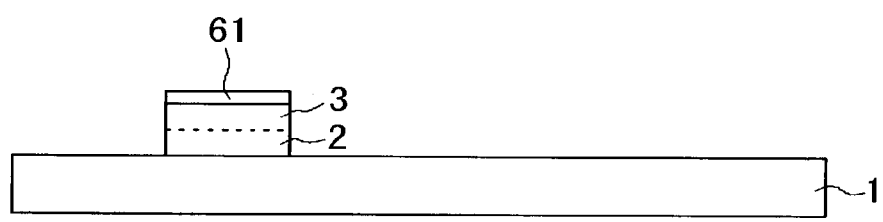
FIG. 38 is a sectional view illustrating a step of fabricating the semiconductor light emitting device according to the sixth embodiment, showing a state that etching is performed by using the mask layer.

Like the first embodiment, as shown in FIG. 37, a GaN layer 2 and a silicon-doped GaN layer 3 are formed on a sapphire substrate 1, and a mask layer 11 made from $SiO_2$ or SiN is formed overall on the silicon-doped GaN layer 3 to a thickness ranging from 100 to 500 nm. The mask layer 11 is patterned such that only a circular mask portion 61 having a diameter of about 10 $\mu$m remains, and as shown in FIG. 38, the GaN layer 2 and the silicon-doped GaN layer 3 are etched via the circular mask portion 61 by photolithography and etching using a hydrofluoric acid based etchant until the principal plane of the sapphire substrate 1 is exposed. As a result, a portion of the GaN layer 2 and a portion of silicon-doped GaN layer 3, each of which is formed into a cylindrical shape corresponding to the shape of the mask portion 61, remain.

After removal of the mask portion 61, crystal growth is performed again. In this case, the growth temperature is raised again to about 1000° C., at which a silicon-doped GaN layer 62 is grown. With respect to crystal growth of the silicon-doped GaN layer 62, the crystal is first grown on the remaining GaN layer 2 and silicon-doped GaN layer 3, and after an elapse of certain time, the crystal becomes a hexagonal pyramid shape surrounded by the S-plane tilted from the principal plane of the sapphire substrate 1. The longer the growth time, the larger the hexagonal pyramid shaped silicon-doped GaN layer 62. Even in the case of sufficiently growing the GaN layer 62, it is required that individual GaN layers 62 be spaced from each other with a pitch being large enough to ensure a margin for separating respective devices from each other without interference of the GaN layers 62 with each other.

Like the first embodiment, when the size, that is, the width of the hexagonal pyramid shape becomes a value in range of about 15 to 20 $\mu$m (length of one side: 7.5 to 15 $\mu$m), the height of the hexagonal pyramid becomes a value in a range of about 10 to 16 $\mu$m (about 1.6 times the length of one side). It is to be noted that the width of the hexagonal pyramid is not limited to a value in the range of about 15 to 20 $\mu$m but may be set to a value in a range of about 10 $\mu$m or less.

Figure 39:
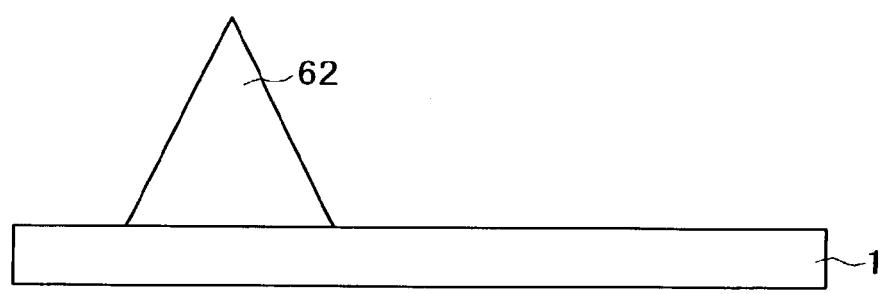
FIG. 39 is a sectional view illustrating a step of fabricating the semiconductor light emitting device according to the sixth embodiment, showing a state that a silicon-doped GaN layer is formed.
Figure 40:
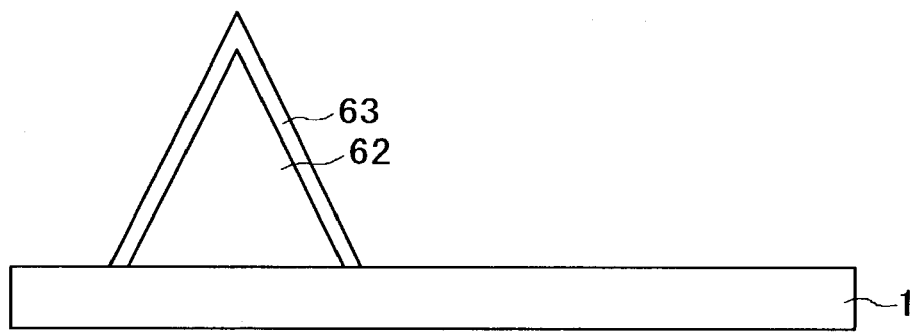
FIG. 40 is a sectional view illustrating a step of fabricating the semiconductor light emitting device according to the sixth embodiment, showing a state that a silicon-doped GaN layer is formed.
Figure 41:
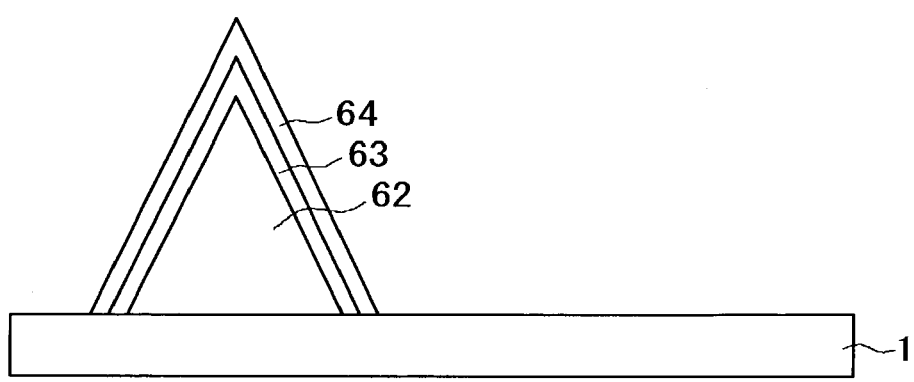
FIG. 41 is a sectional view illustrating a step of fabricating the semiconductor light emitting device according to the sixth embodiment, showing a state that a magnesium-doped GaN layer is formed.

After the hexagonal pyramid shaped silicon-doped GaN layer 62 surrounded by the S-plane is grown as shown in FIG. 39, the growth of the silicon-doped GaN layer 62 is further continued. After that, the growth temperature is lowered, and as shown in FIG. 40, an InGaN layer 63 is grown on the silicon-doped GaN layer 62, and the growth temperature is raised, and as shown in FIG. 41, a magnesium-doped GaN layer 64 is grown on the InGaN layer 63. The thickness of the InGaN layer 63 is in a range of about 0.5 to 3 nm. The active layer may be configured as a quantum well layer or a multi-quantum well layer of (Al)GaN/InGaN, or a multiple structure using GaN or InGaN functioning as a guide layer. In this case, it is preferred to grow an AlGaN layer directly on an InGaN layer.

Figure 42:
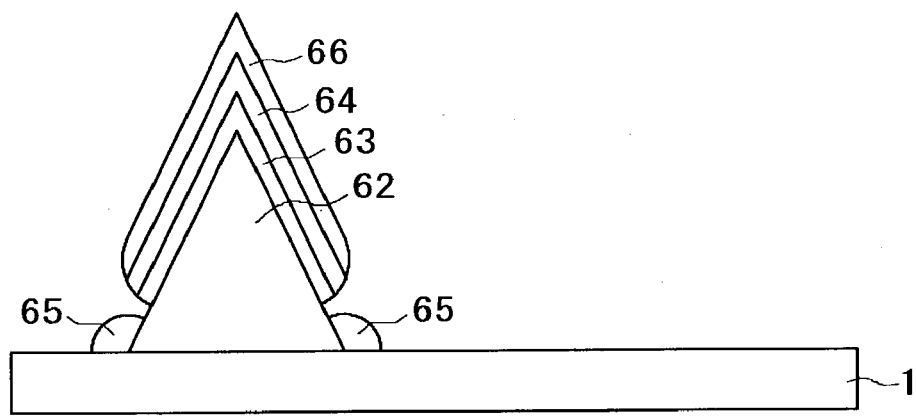
FIG. 42 is a sectional view illustrating a step of fabricating the semiconductor light emitting device according to the sixth embodiment, showing a state that a p-electrode and an n-electrode are formed.

A portion of the InGaN layer 63 as the active layer and a portion of the magnesium-doped GaN layer 64 as a p-type cladding layer, each portion being located close to the sapphire substrate 1, are removed, to expose a portion of the silicon-doped GaN layer 62. As shown in FIG. 42, a metal material Ti/Al/Pt/Au is vapor-deposited on the exposed portion, close to the sapphire substrate 1, of the silicon-doped GaN layer 62, to form an n-electrode 65. A metal material Ni/Pt/Au or Ni(Pd)/Pt/Au is vapor-deposited on the uppermost surface of the hexagonal pyramid shaped stacked structure, to form a p-electrode 66 as shown in FIG. 42. Like the first embodiment, in this step, it is required to accurately form the n-electrode 65 and the p-electrode 66 by vapor-deposition for preventing short-circuit between both the electrodes.

Figure 43:
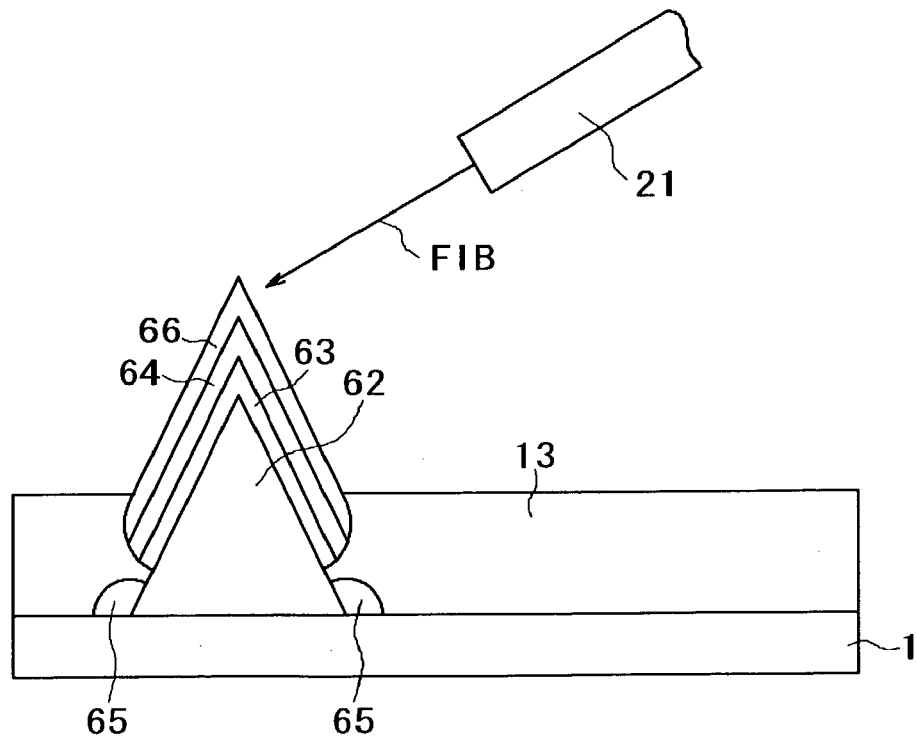
FIG. 43 is a sectional view illustrating a step of fabricating the semiconductor light emitting device according to the sixth embodiment, showing a state that the apex and its vicinity of a stacked layer structure are irradiated by FIB.
Figure 44:
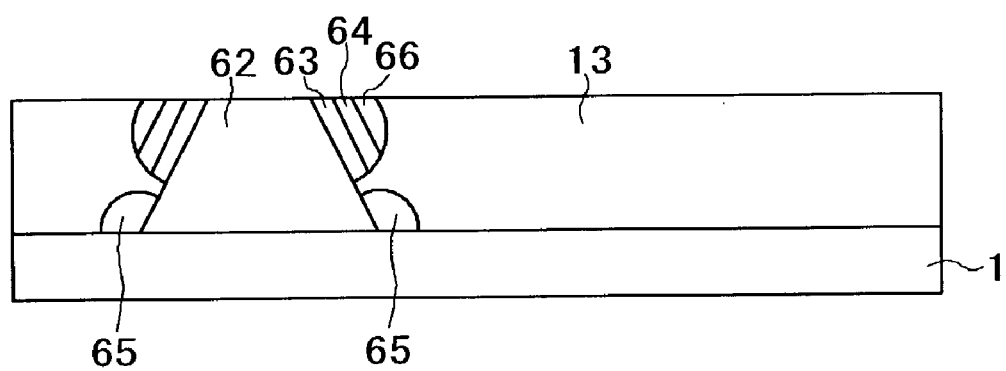
FIG. 44 is a sectional view illustrating a step of fabricating the semiconductor light emitting device according to the sixth embodiment, showing a state that the stacked layer structure becomes a so-called approximately hexagonal truncated pyramid shape by irradiation of FIB.

As shown in FIG. 43, the stacked structure is buried with a resin 13. The height of the resin 13 is set to that of an approximately mid point of the p-electrode 66. Subsequently, as shown in FIG. 43, the apex and its vicinity of the hexagonal pyramid shaped stacked structure are irradiated with ion beams by the FIB apparatus 21, whereby a portion, ranging from the apex and its vicinity to an approximately mid point, of the approximately hexagonal pyramid shape, is cut off as shown in FIG. 44. As a result, the stacked structure becomes a so-called approximately hexagonal truncated pyramid shape. It is to be noted that the height of the stacked structure after FIB irradiation treatment is required to be set to such a value that the apex and its vicinity of the silicon-doped GaN layer 62 are certainly removed.

Accordingly, the approximately hexagonal truncated pyramid shaped silicon-doped GaN layer 62 thus formed by FIB irradiation does not contain threading dislocations having been present so as to extend from the sapphire substrate 1 to the apex and its vicinity of the approximately hexagonal pyramid silicon-doped GaN layer 62 in the state before FIB irradiation, and also does not contain a portion whose crystallinity is poor because the apex and its vicinity, in which crystallinity is poor, of the approximately hexagonal pyramid silicon-doped GaN layer 62 have been removed by FIB irradiation. Namely, the crystallinity of the remaining approximately hexagonal truncated pyramid shaped silicon-doped GaN layer 4 is excellent. As a result, it is possible to prevent occurrence of leakage of current due to threading dislocations and poor crystallinity at the apex or in the apex and its vicinity and hence to prevent the luminous efficiency from being reduced due to leakage of current.

Figure 45:
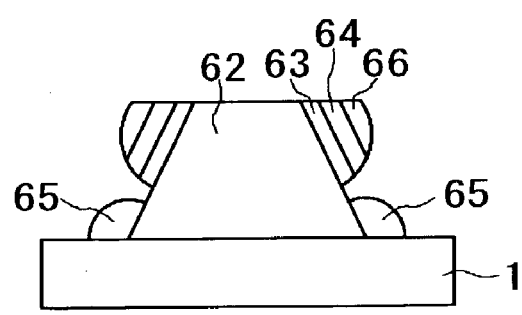
FIG. 45 is a sectional view illustrating a step of fabricating the semiconductor light emitting device according to the sixth embodiment, showing a state that the resin is removed, and the device structure is separated into individual semiconductor light emitting devices.

The resin 13 is removed and then the device structure is separated into individual semiconductor light emitting devices by RIE (Reactive Ion Etching) or by using a dicer. A semiconductor light emitting device shown in FIG. 45 is thus accomplished.

<Embodiment 7>

In this embodiment, a semiconductor light emitting device in which the bottom surface side of the hexagonal truncated pyramid shape is removed will be described with reference to FIGS. 46 and 47.

Figure 46:
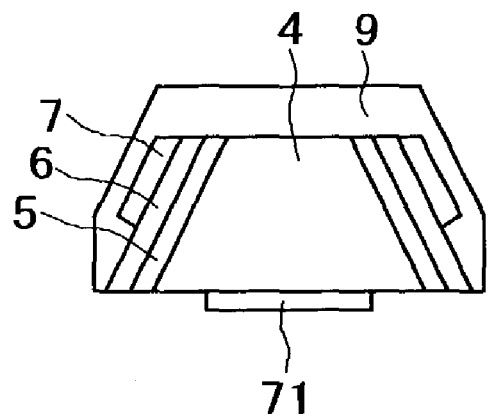
FIG. 46 is a sectional view showing a semiconductor light emitting device according to a seventh embodiment.
Figure 47:
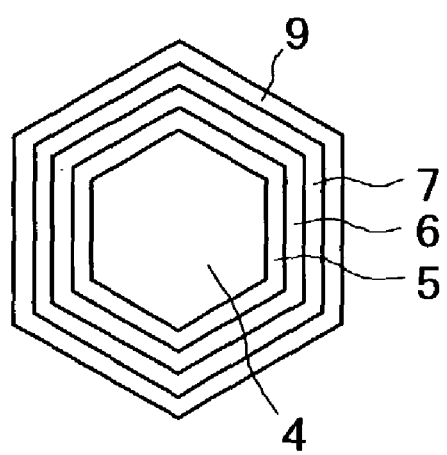
FIG. 47 is a top view showing an approximately hexagonal pyramid portion of the semiconductor light emitting device according to the seventh embodiment.

The semiconductor light emitting device shown in FIGS. 46 and 47 is equivalent to the semiconductor light emitting device shown in FIGS. 1 and 2 except that the bottom surface side of the hexagonal truncated pyramid shape is removed. According to this embodiment, in addition to the effect obtained by the first embodiment, there can be obtained an effect of thinning the semiconductor light emitting device.

Figure 48:
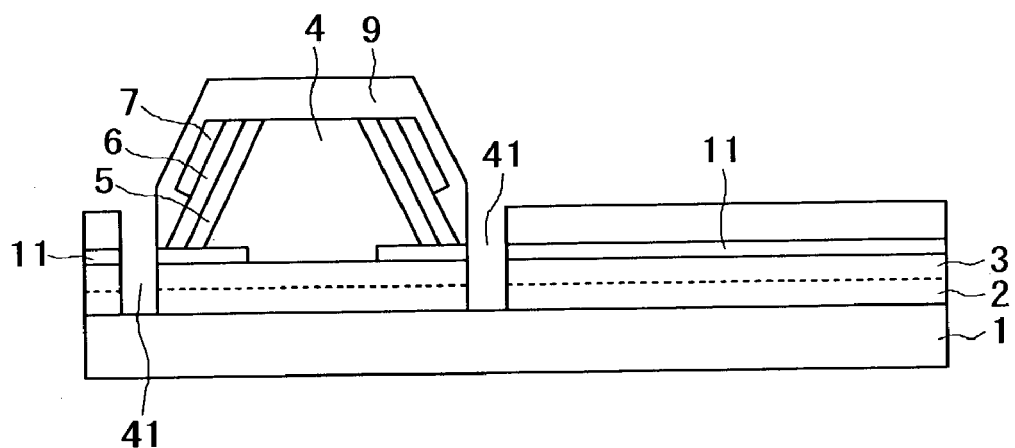
FIG. 48 is a sectional view illustrating a step of fabricating the semiconductor light emitting device according to the seventh embodiment, showing a state that isolation grooves are formed.
Figure 49:
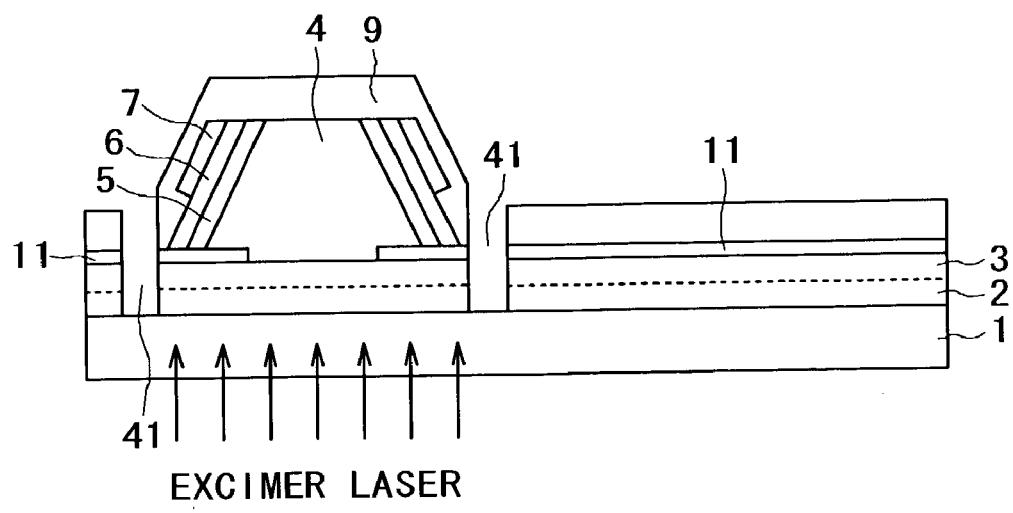
FIG. 49 is a sectional view illustrating a step of fabricating the semiconductor light emitting device according to the seventh embodiment, showing a state that the semiconductor light emitting device is peeled from a substrate.

First, a semiconductor light emitting device is formed in accordance with the above-described steps shown in FIGS. 30 to 35. Isolation grooves 41 are formed in the device structure by RIE (reactive Ion Etching) or by using a dicer, and the device structure is separated into individual devices on a sapphire substrate 1 as shown in FIG. 48.

Figure 50:
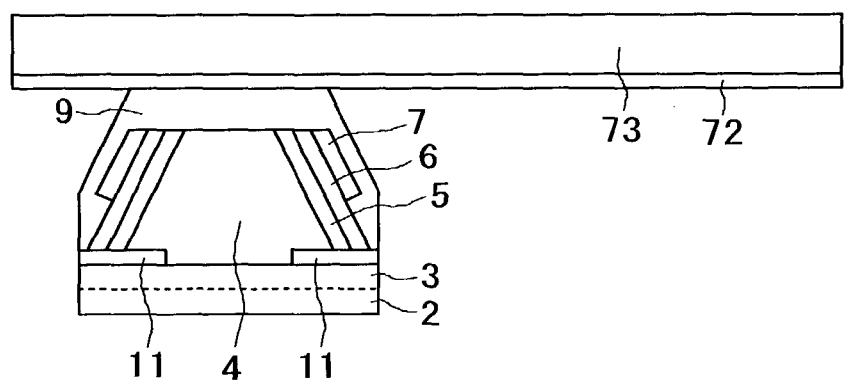
FIG. 50 is a sectional view illustrating a step of fabricating the semiconductor light emitting device according to the seventh embodiment, showing a state that the semiconductor light emitting device is transferred to a transfer substrate.
Figure 51:
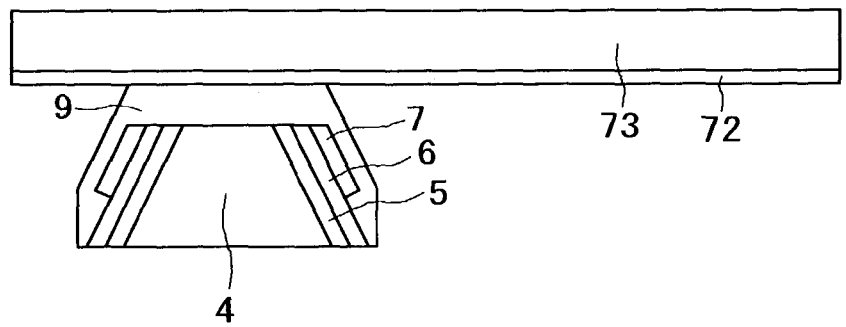
FIG. 51 is a sectional view illustrating a step of fabricating the semiconductor light emitting device according to the seventh embodiment, showing a state that a bottom surface side of the semiconductor light emitting device is removed.

A boundary between each device and the sapphire substrate 1 is irradiated with excimer laser beams from the back surface of the sapphire substrate 1, whereby a device region including each device is peeled from the sapphire substrate 1 by laser abrasion and is transferred to a transfer substrate 73 provided with an adhesive layer 72 as shown in FIG. 50. As shown in FIG. 51, the bottom surface side of the hexagonal pyramid shaped device is removed to a thickness not reaching a p-electrode 7. The removal of the bottom surface side of the device may be performed by any of the above-described means, that is, any one of the CMP apparatus, FIB apparatus, and the laser apparatus.

Figure 52:
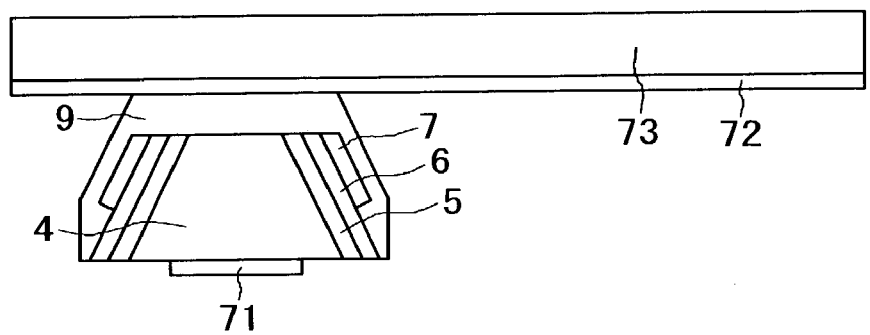
FIG. 52 is a sectional view illustrating a step of fabricating the semiconductor light emitting device according to the seventh embodiment, showing a state that an n-electrode is formed.
Figure 53:
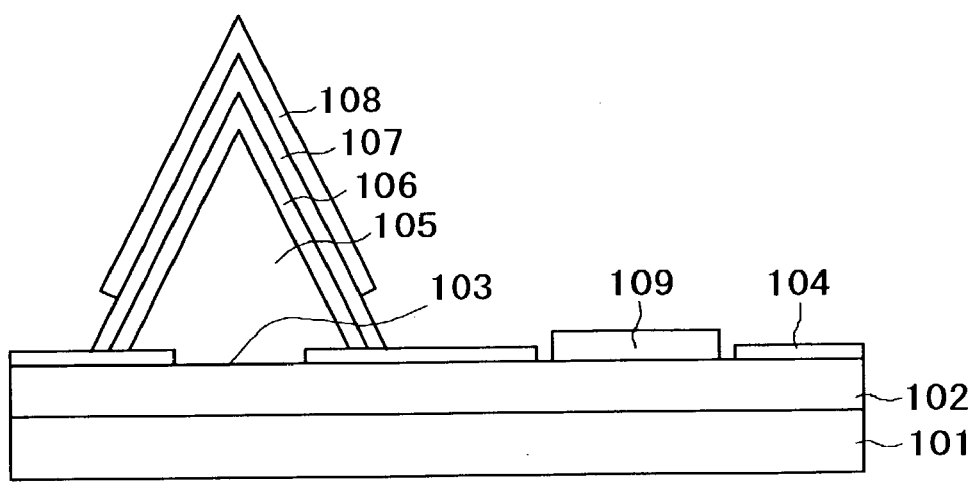
FIG. 53 is a sectional view showing a related art semiconductor light emitting device.

As shown in FIG. 52, a metal material Ti/Al/Pt/Au is vapor-deposited on a back surface portion of the device, to form an n-electrode 71. The device is then transferred to a specific substrate, to thereby obtain a semiconductor light emitting device including the n-electrode 71 on the back surface thereof, which device has a desirably luminous efficiency and is thinned shown in FIGS. 46 and 47.

While the preferred embodiments of the present invention have been described using the specific terms, such description is for illustrative purposes only, and it is to be understood that changes and variations may be made without departing from the spirit and the scope of the following claims.

What is claimed is:

1. A semiconductor light emitting device comprising:
   a crystal layer formed on a substrate, said crystal layer having a tilt crystal plane tilted from the principal plane of said substrate; and
   a first conductive type layer, an active layer, and a second conductive type layer, which are formed on said crystal layer in such a manner as to extend within planes parallel to said tilt crystal plane;
   wherein said device has a shape formed by removing an apex and its vicinity, the apex including portions of the first conductive type layer, the active layer, the second conductive type layer, and said crystal layer structure formed on said substrate, and wherein the apex is removed such that there remains a substantially planar surface that is generally parallel to the substrate.

2. A semiconductor light emitting device according to claim 1, wherein said apex and its vicinity are removed along a plane parallel to the principal plane of said substrate or a plane substantially equivalent to the principal plane of said substrate.

3. A semiconductor light emitting device according to claim 1, wherein said crystal layer has a wurtzite type crystal structure.

4. A semiconductor light emitting device according to claim 1, wherein said crystal layer is made from a nitride semiconductor.

5. A semiconductor light emitting device according to claim 1, wherein said crystal layer is formed by selective growth on said substrate via an underlying growth layer.

6. A semiconductor light emitting device according to claim 5, wherein said selective growth is performed by making use of selective removal of said underlying growth layer.

7. A semiconductor light emitting device according to claim 5, wherein said selective growth is performed by making use of an opening selectively formed in a mask layer.

8. A semiconductor light emitting device according to claim 7, wherein said crystal layer is formed by selective growth from said opening of said mask layer in such a manner as to extend outwardly from said opening in the lateral direction.

9. A semiconductor light emitting device according to claim 1, wherein the principal plane of said substrate is the C-plane.

10. A semiconductor light emitting device according to claim 1, wherein said tilt crystal plane includes at least one of the S-plane and the (11-22) plane.

11. A semiconductor light emitting device according to claim 1, wherein said active layer is made from InGaN.

* * * * *